United States Patent
Tang et al.

(10) Patent No.: US 10,975,827 B2
(45) Date of Patent: Apr. 13, 2021

(54) IGNITION CONTROL SYSTEM WITH CIRCULATING-CURRENT CONTROL

(71) Applicant: SEMICONDUCTOR COMPONENTS INDUSTRIES, LLC, Phoenix, AZ (US)

(72) Inventors: Qingquan Tang, Breinigsville, PA (US); Hirotada Honma, Kita-ku (JP); Hajime Takahashi, Wilkes-Barre, PA (US); Mitchell Henry, Wilkes Barre, PA (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 26 days.

(21) Appl. No.: 16/250,407

(22) Filed: Jan. 17, 2019

(65) Prior Publication Data
US 2020/0095971 A1 Mar. 26, 2020

Related U.S. Application Data

(60) Provisional application No. 62/736,601, filed on Sep. 26, 2018.

(51) Int. Cl.
*H02M 3/156* (2006.01)
*F02P 3/055* (2006.01)
(Continued)

(52) U.S. Cl.
CPC .......... *F02P 3/0552* (2013.01); *F02P 3/0453* (2013.01); *F02P 3/051* (2013.01); *F02P 9/002* (2013.01);
(Continued)

(58) Field of Classification Search
CPC ........ F02P 3/0552; F02P 3/0453; F02P 3/051; F02P 9/002; H01T 15/00; H03K 17/0828; H03K 17/567
(Continued)

(56) References Cited

U.S. PATENT DOCUMENTS 4,377,785 A 3/1983 Ueno et al.
4,446,842 A 5/1984 Iwasaki
(Continued)

FOREIGN PATENT DOCUMENTS

| EP | 0922856 A2 | 6/1999 |
| EP | 2873850 A1 | 5/2015 |
| JP | 0304746 A | 2/1991 |

OTHER PUBLICATIONS

Qingguan Tang, "Ignition Control System for a High-Voltage Battery System," U.S. Appl. No. 15/914,370, filed Mar. 7, 2018.

*Primary Examiner* — Gonzalo Laguarda
(74) *Attorney, Agent, or Firm* — Brake Hughes Bellermann LLP

(57) ABSTRACT

In an implementation, a method of operating an ignition circuit can include enabling a charge path control circuit and a switch circuit to charge a primary winding of an ignition coil of the ignition circuit until a threshold current is reached in the primary winding. After reaching the threshold current in the primary winding, the method can include maintaining a current in the primary winding of the ignition coil in correspondence with a current limit by alternatively activating and deactivating the charge path control circuit complementary to alternative activation and deactivation of a circulating-current path control circuit. During the maintaining the current in the primary winding, the method can include initiating a spark in a spark plug included in the ignition circuit, the initiating the spark including controlling
(Continued)

an amount of energy delivered from the primary winding to a secondary winding of the ignition coil.

20 Claims, 16 Drawing Sheets

(51) Int. Cl.
    *F02P 3/045*     (2006.01)
    *F02P 9/00*     (2006.01)
    *H03K 17/567*     (2006.01)
    *H01T 15/00*     (2006.01)
    *H03K 17/082*     (2006.01)
    *F02P 3/05*     (2006.01)

(52) U.S. Cl.
    CPC ......... *H01T 15/00* (2013.01); *H03K 17/0828* (2013.01); *H03K 17/567* (2013.01); *H02M 3/156* (2013.01)

(58) Field of Classification Search
    USPC ....... 123/605, 618, 619, 621, 622, 644, 650, 123/655, 656; 361/249, 253, 264
    See application file for complete search history.

(56) References Cited

U.S. PATENT DOCUMENTS

| | | |
|---|---|---|
| 4,449,100 A | 5/1984 | Johnson et al. |
| 5,686,839 A | 11/1997 | Takagi |
| 5,819,713 A | 10/1998 | Kesler |
| 5,970,964 A | 10/1999 | Furuhata et al. |
| 5,979,406 A | 11/1999 | Aoki et al. |
| 6,057,728 A | 5/2000 | Igarashi |
| 6,196,208 B1 | 3/2001 | Masters |
| 6,492,818 B1 | 12/2002 | Downs |
| 9,531,264 B2 * | 12/2016 | Ryan ..................... H02J 7/0063 |
| 9,698,574 B2 | 7/2017 | Yamamoto et al. |
| 9,735,663 B2 * | 8/2017 | Bhasin ..................... H02M 1/08 |
| 2002/0056445 A1 | 5/2002 | Inagaki et al. |
| 2002/0144544 A1 | 10/2002 | Kesler |
| 2004/0085697 A1 | 5/2004 | Kesler et al. |
| 2005/0178372 A1 | 8/2005 | Kesler et al. |
| 2006/0244496 A1 | 11/2006 | Kawakita |
| 2008/0180158 A1 | 7/2008 | Scollo et al. |
| 2008/0202485 A1 | 8/2008 | Garrard |
| 2009/0126710 A1 | 5/2009 | Alger, II et al. |
| 2009/0139505 A1 | 6/2009 | Naito et al. |
| 2010/0263644 A1 | 10/2010 | Matsuda et al. |
| 2012/0085327 A1 | 4/2012 | Mizukami et al. |
| 2012/0215431 A1 | 8/2012 | Miyazawa |
| 2013/0152910 A1 | 6/2013 | Minoya et al. |
| 2013/0199485 A1 | 8/2013 | Shibata et al. |
| 2013/0335864 A1 | 12/2013 | Trecarichi et al. |
| 2015/0041849 A1 | 2/2015 | Gillberg et al. |
| 2015/0176558 A1 | 6/2015 | Glugla et al. |
| 2016/0222939 A1 | 8/2016 | Tang et al. |
| 2017/0009727 A1 | 1/2017 | Nakamura |
| 2019/0162155 A1 * | 5/2019 | Frank ..................... F02P 3/0442 |
| 2019/0280464 A1 | 9/2019 | Tang |

* cited by examiner

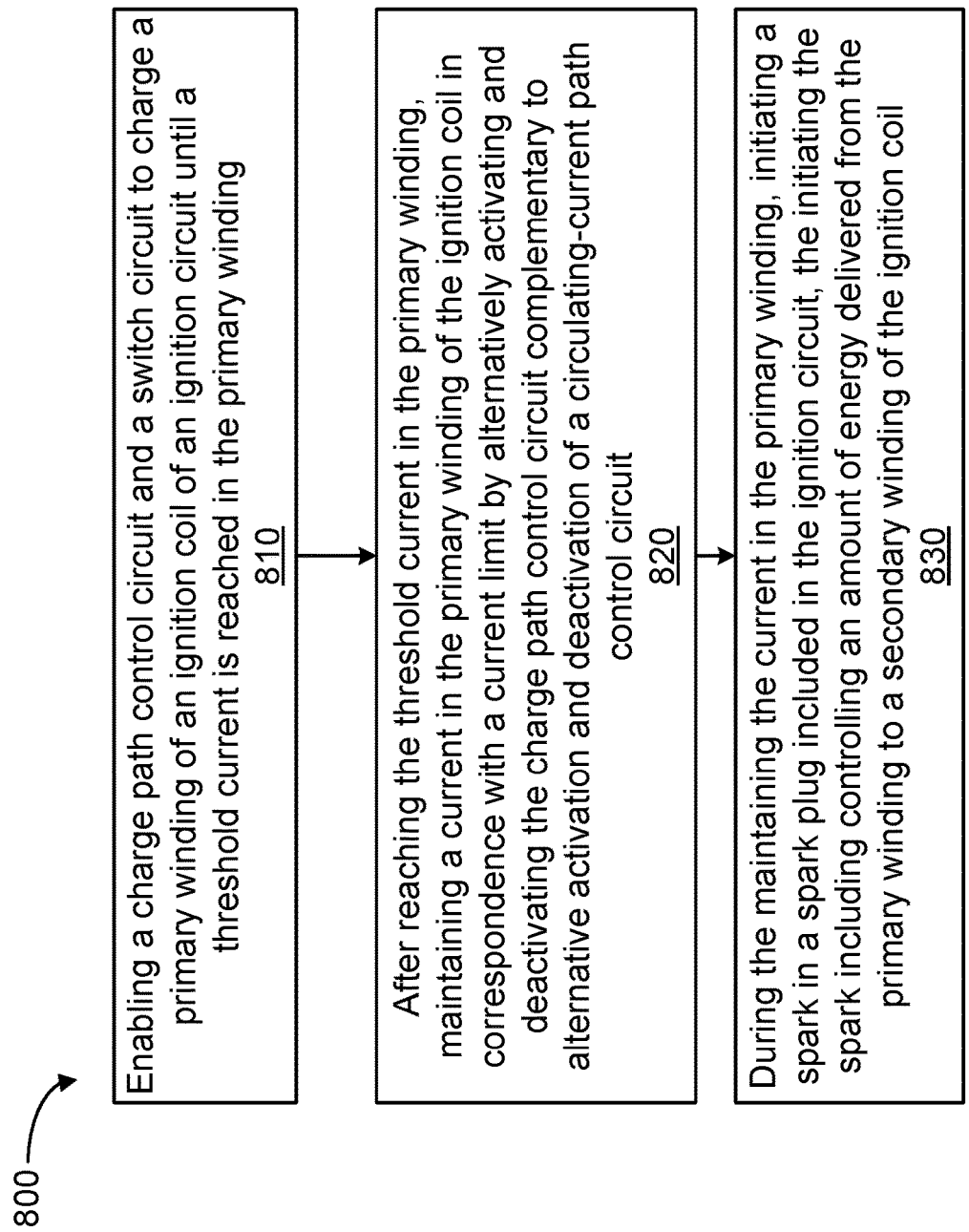

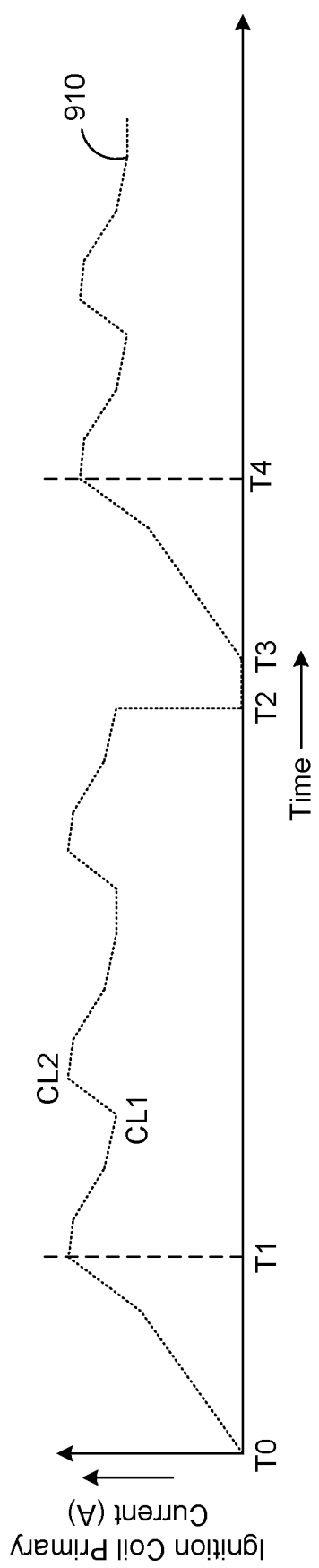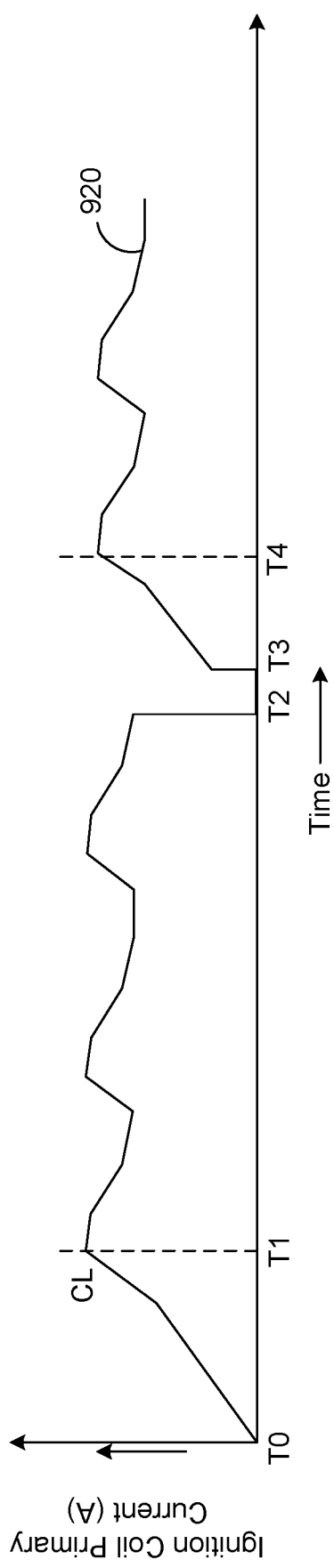

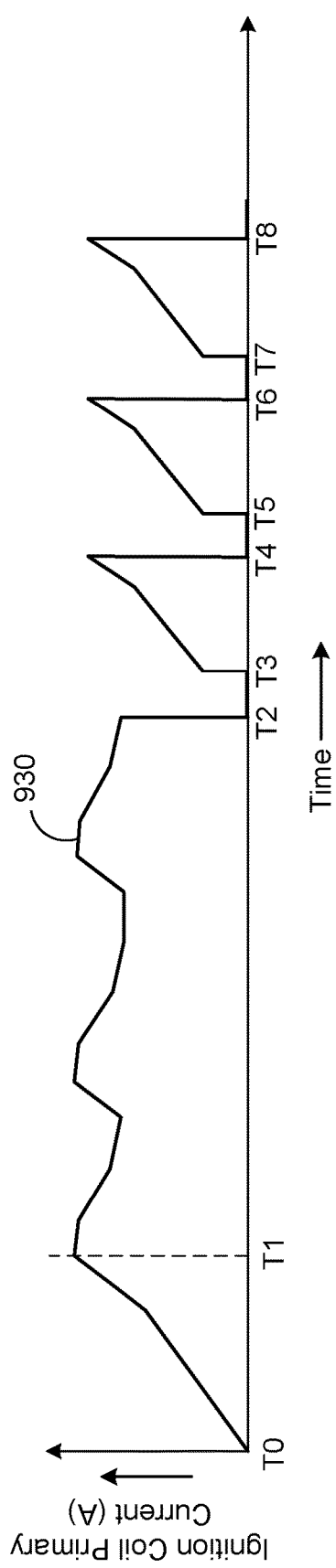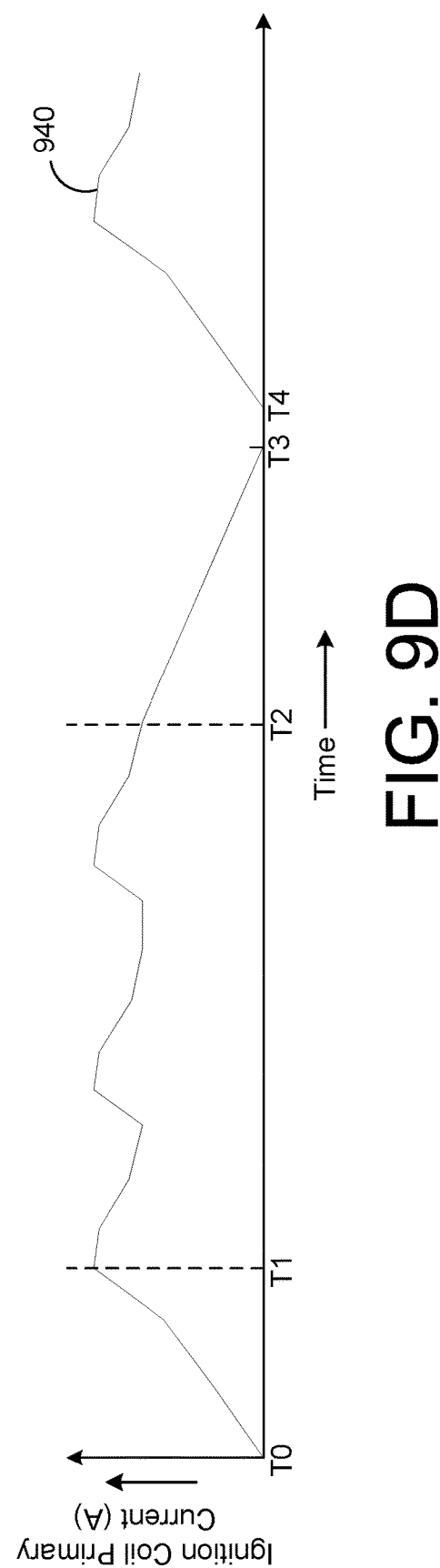

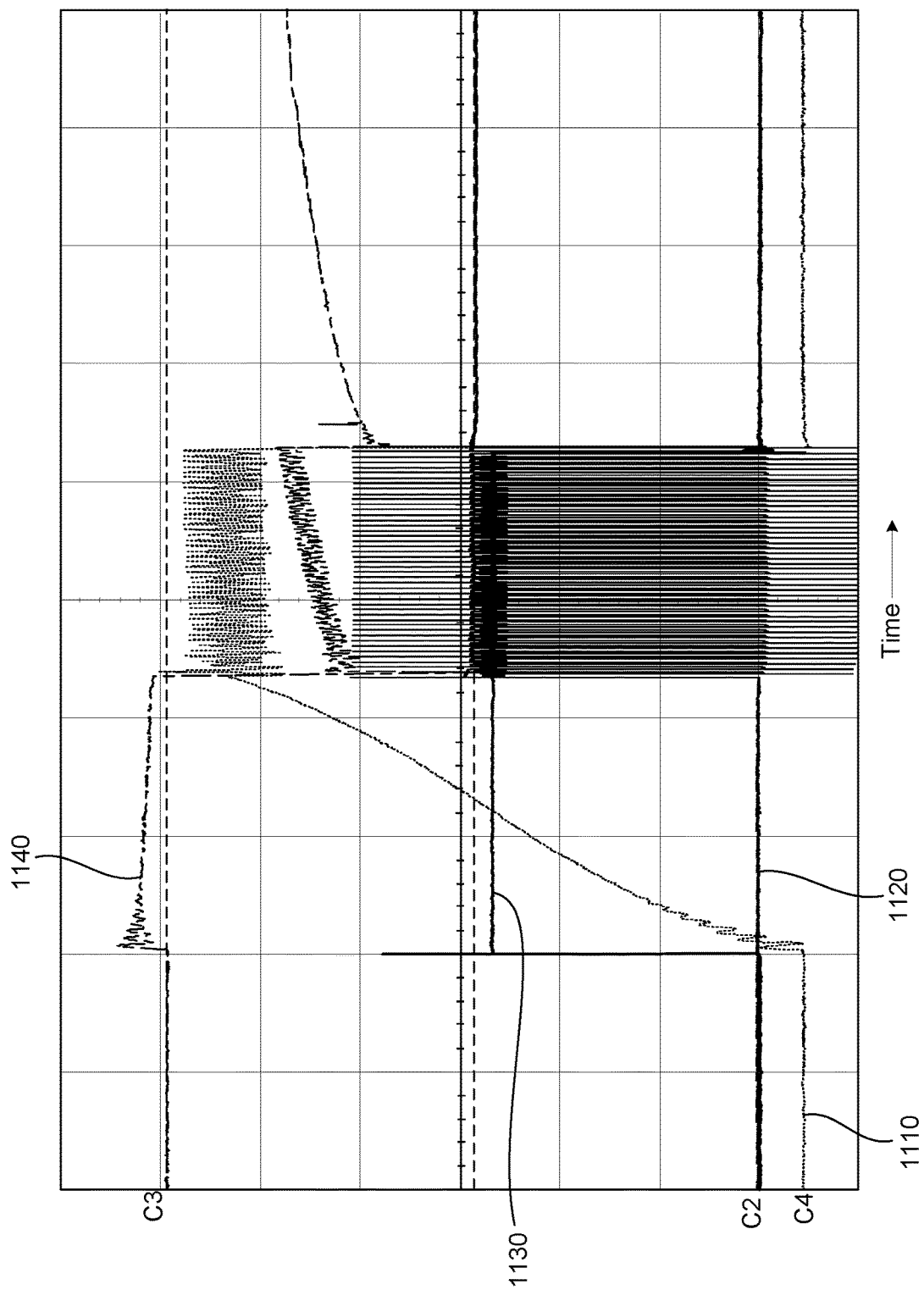

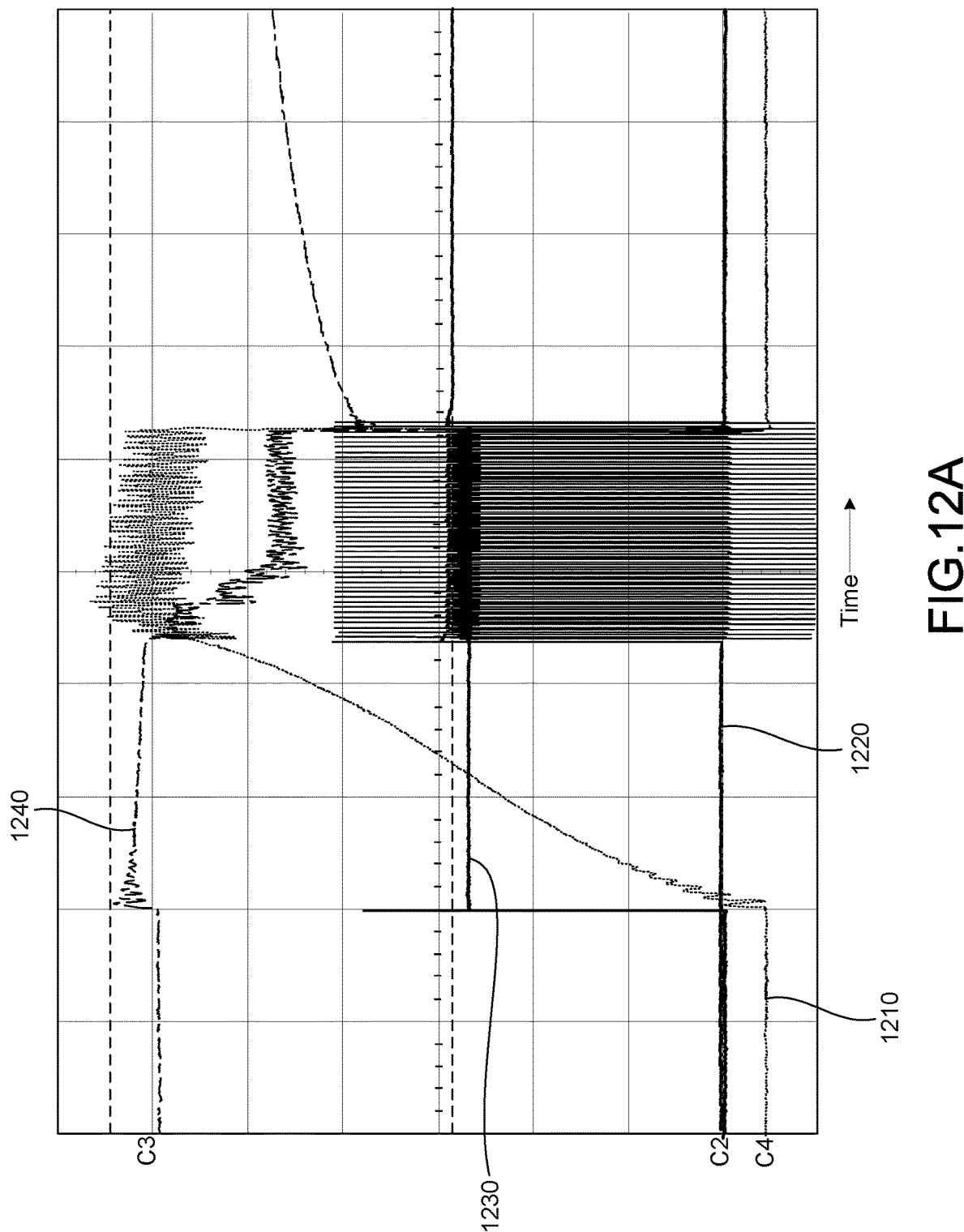

IGNITION CONTROL SYSTEM WITH CIRCULATING-CURRENT CONTROL

CROSS-REFERENCE TO RELATED APPLICATION

This application claims priority to and the benefit of U.S. Provisional Application No. 62/736,601, filed Sep. 26, 2018, entitled "IGNITION WITH CIRCULATING CURRENT CONTROL", the contents of which is hereby incorporated by reference in its entirety.

TECHNICAL FIELD

This description relates to ignition systems that can operate using circulating-current control in an ignition coil.

BACKGROUND

Ignition systems, such as automotive ignitions systems, can be implemented using a variety of high voltage devices such as insulated-gate bipolar transistor (IGBT) devices, ignition coils, and so forth. In current implementations of ignition systems, a command signal (e.g., from an engine control unit) is provided to an ignition control circuit (e.g., where there is an ignition control circuit and ignition circuit per vehicle cylinder). In response to the command signal changing from a first logic state to a second (opposite) logic state (e.g., logic low to logic high), the control circuit turns on an ignition IGBT to charge a primary winding of an ignition coil. After a dwell period (dwell time, primary winding charging time, etc.), the command signal from the ECU changes from the second logic state back to the first logic state (e.g., logic high to logic low). In response to the command signal changing from the second logic state back to the first logic state, the control circuit turns off the ignition IGBT, causing the primary winding to stop conducting current (stop charging), which results in energy stored in the primary winding being transferred to a secondary winding of the ignition coil to initiate a sparking event in a spark plug coupled with the secondary winding.

Such ignition systems, however, experience very high power dissipation (and associated heating) in the ignition IGBT and/or the ignition coil (e.g., particularly in ignition systems with high voltage batteries, such as 24 volt batteries, 48 volt batteries, etc.). Such current implementations of ignition systems also require precise dwell timing be delivered by the ECU, to prevent under dwell (e.g., insufficient energy to generate a spark) or over dwell (e.g., resulting in an overcurrent in the primary winding), which can damage (e.g., electrically overstress) the ignition coil, the ignition IGBT and/or the ignition system, as well as create hazardous conditions, such as an engine fire.

SUMMARY

In an implementation, a circuit can include a switch circuit configured to be electrically connected to a first terminal of a primary winding of an ignition coil included in an ignition circuit. The circuit can further include a charge path control circuit electrically coupled between the switch circuit and a ground terminal, such that the primary winding, the switch circuit and the charge path control circuit are electrically coupled in series. The circuit can also include a circulating-current path control circuit electrically connected between the switch circuit and a battery terminal, where the battery terminal can being configured to be electrically connected to a second terminal of the primary winding of the ignition coil. The circuit can still further include a control circuit configured to operate the switch circuit, the charge path control circuit and the circulating-current path control circuit to: provide a current to charge the primary winding of the ignition coil until a threshold current is reached in the primary winding; after reaching the threshold current in the primary winding, maintain a current in the primary winding of the ignition coil in correspondence with a current limit; and, during the maintaining the current in the primary winding, initiate a spark in a spark plug included in the ignition circuit. The initiating the spark can include controlling an amount of energy delivered from the primary winding to a secondary winding of the ignition coil.

In another implementation, a circuit can include a switch circuit configured to be electrically connected to a first terminal of a primary winding of an ignition coil included in an ignition circuit. The circuit can also include a ground terminal, a battery terminal, and a charge path control circuit. The charge path control circuit can be electrically coupled with the battery terminal and configured to be electrically coupled with a second terminal of the primary winding, such that the battery terminal, the charge path control circuit, the primary winding and the switch circuit are electrically coupled in series. The circuit can further include a circulating-current path control circuit that is electrically coupled with the ground terminal and configured to be electrically coupled with a second terminal of the primary winding. The circuit can also further include a control circuit configured to operate the switch circuit, the charge path control circuit and the circulating-current path control circuit to: provide a current to charge the primary winding of the ignition coil until a threshold current is reached in the primary winding; after reaching the threshold current in the primary winding, maintain a current in the primary winding of the ignition coil in correspondence with a current limit; and during the maintaining the current in the primary winding, initiate a spark in a spark plug included in the ignition circuit. The initiating the spark can include controlling an amount of energy delivered to a secondary winding of the ignition coil.

In yet another implementation, a method for operating an ignition circuit can include enabling a charge path control circuit and a switch circuit to charge a primary winding of an ignition coil of the ignition circuit until a threshold current is reached in the primary winding. The charge path control circuit, the primary winding and the switch circuit can be electrically coupled in series. The method can further include, after reaching the threshold current in the primary winding, maintaining a current in the primary winding of the ignition coil in correspondence with a current limit by alternatively activating and deactivating the charge path control circuit complementary to alternative activation and deactivation of a circulating-current path control circuit. The circulating-current path control circuit, the primary winding and the switch circuit can be electrically coupled in series in a looped path. The method can also include, during the maintaining the current in the primary winding, initiating a spark in a spark plug included in the ignition circuit. The initiating the spark can include controlling an amount of energy delivered from the primary winding to a secondary winding of the ignition coil.

BRIEF DESCRIPTION OF THE DRAWINGS

FIG. 8 is flowchart that illustrates a method of operating an ignition system, such as the ignition systems of FIGS. 1, 2, 5 and 6 using circulating-current control.

FIGS. 9A, 9B, 9C and 9D are diagrams that illustrate current in a primary winding of an ignition coil of an ignition system that is operated using circulating-current control.

FIGS. 11A and 11B are diagrams that collectively illustrate operation of an ignition system using a fixed frequency and fixed duty ratio control signal to implement circulating-current control.

FIGS. 12A and 12B are diagrams that collectively illustrate operation of an ignition system using a fixed frequency and variable duty ratio control signal to implement circulating-current control.

In the drawings, like elements are referenced with like reference numerals or like reference characters.

DETAILED DESCRIPTION

Figure 1:
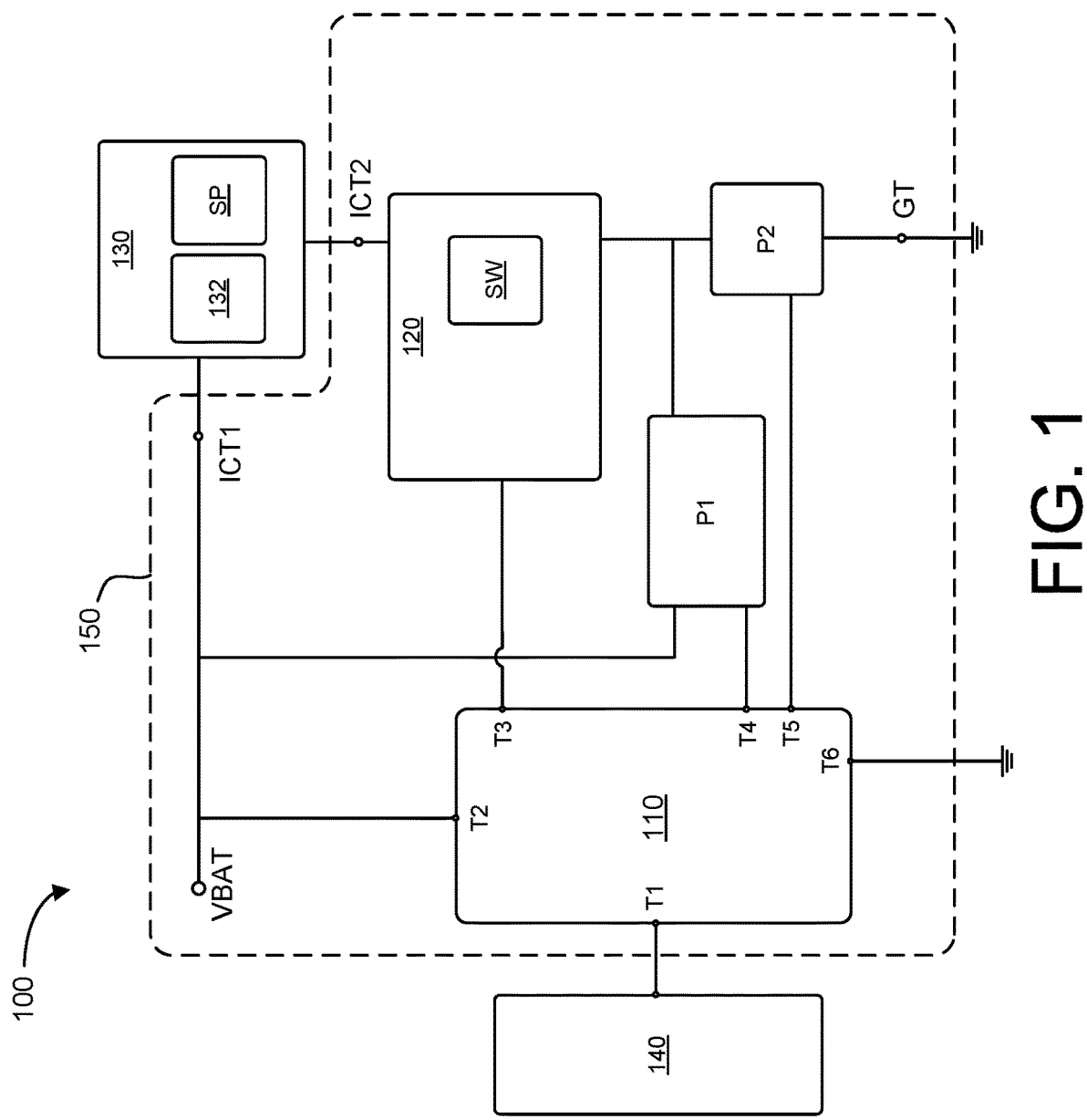
FIG. 1 is a diagram that illustrates an ignition system including an ignition circuit, an engine control unit (ECU), and an ignition control circuit.

An inductive discharge ignition system, such as the ignition systems described herein, can be used to ignite a fuel mixture in a cylinder of an internal combustion engine. Ignition systems may operate in relatively harsh environments and, therefore, can be subject to failure as a result of these operating conditions, as well as other factors that may cause system failure. These ignition systems can include devices configured to operate at relatively high voltages (e.g., 400 V or more) because the devices can be used as, for example, ignition coil drivers and as protection circuits for the ignition coil drivers. The ignition systems (and associated methods) described herein can be configured to operate within and manage these harsh and high-voltage environments.

For example, the ignition systems (and associated methods) described herein can be configured to operate by regulating a circulating current through an ignition coil (e.g., through a primary winding of the ignition coil), which, as described below, can reduce power dissipation and electrical stress within the ignition system as compared to prior approaches. For instance, control path circuits included in an ignition control circuit of an ignition system (such as the control path circuits described herein) can be used to maintain current (charge, stored energy, etc.) in an ignition coil at a level sufficient to initiate a spark event (e.g., when requested by an engine control unit (ECU)), but also avoid generating an unwanted spark event while the ignition coil is charged. Such control path circuits can also be configured to slowly dissipate energy stored in an ignition coil, such as to prevent hazardous conditions in the ignition system, such as electrical overstress of the components of the ignition system, which could damage the ignition system and/or result in an engine fire.

In the approaches described herein, because energy stored in an ignition coil can be maintained at a level sufficient for initiating a spark event, spark events can be initiated, when needed (e.g., based on a command signal from an ECU), without the need for precise dwell timing of prior implementations. Accordingly, such approaches can reduce the complexity of an associated control circuit. Also, the use of circulating circuit control, as described herein, can allow power devices included in an ignition, such as an insulated-gate bipolar transistor (IGBT) device, to be operated in saturation mode, rather than in linear mode (to perform a current limiting function) as in prior implementations, which can reduce power dissipation of such ignition systems and also reduce associated heating of the components of the ignition system. Accordingly, the approaches described herein can reduce electrical stress on the ignition system components, improve system reliability and help prevent hazardous conditions from occurring.

Additionally, in the approaches described herein, an amount of energy delivered from a primary winding of an ignition coil to a secondary winding of the ignition coil to generate a spark event can be controlled (e.g., based on timing of the command signal), rather than fully charging and discharging the ignition coil for each spark event (e.g., using precise dwell timing). That is, in current approaches, a command signal from an ECU can be used for timing initiation and duration of a spark event, rather than for precise dwell timing to fully charge an ignition coil (e.g., to a desired energy level) and then generate a sparking even that fully discharges the ignition coil. Accordingly, the approaches described herein can further reduce power dissipation of an ignition system, as compared to prior implementations.

FIG. 1 is a diagram that illustrates an ignition system 100 including an ignition circuit 130, an engine control unit (ECU) 140, and an ignition control circuit 150. The ignition circuit 130 can include at least an ignition coil 132 and a spark plug SP. The ECU 140 can be configured to communicate with the ignition control circuit 150 to control charging (and discharging) of the ignition coil 132 within the ignition circuit 130. The ignition circuit 130 is electrically connected to the ignition control circuit 150 via ignition circuit terminals ICT1, ICT2.

As shown in FIG. 1, the ignition control circuit 150 includes a control circuit 110, a switch circuit 120, a circulating-current path control circuit P1 (which can also be referred to as a high-side control path circuit in this implemenation), and a charge path control circuit P2 (which can also be referred to as a low-side path control circuit in this implementation). The circulating-current path control circuit P1 and the charge path control circuit P2 can be collectively referred to as path control circuits P. The switch circuit 120 includes a switch device SW, which can be electrically connected to the ignition circuit 130 (and a terminal of the ignition coil 132) via the ignition circuit terminal ICT2. The control circuit 110 is configured to interface with the ECU 140. The switch device SW can be, or can include, a transistor device (e.g., an IGBT, a metal-oxide-semiconductor field-effect transistor (MOSFET) device, etc.).

The path control circuits P are configured to control energy (e.g., current) along various paths within the ignition control circuit 150, and can be used to maintain energy (charge) stored in a primary winding of the ignition coil 132 using circulating-current control, such as using the approaches described herein. In some implementations, the circulating-current path control circuit P1 and the charge path control circuit P2 are configured to control the routing of energy (e.g., during circulating-current control) from the ignition circuit 130 within the ignition control circuit 150.

As shown in FIG. 1, the circulating-current path control circuit P1 is electrically connected between a battery terminal VBAT and the switch circuit 120. In this implementation, the circulating-current path control circuit P1 is directly connected with the battery terminal VBAT. In other words, in this example implementation, other circuit elements are not electrically connected (e.g., are excluded) between the battery terminal VBAT and the circulating-current path control circuit P1. In some implementations, a sensing element (e.g., a current-sensing resistor) can be included between the Vbat terminal and the circulating-current path control circuit P1. In this implementation, the circulating-current path control circuit P1 is parallel to the ignition coil 132 and the switch device SW. The circulating-current path control circuit P1 is also electrically connected between a battery terminal VBAT and the charge path control circuit P2. In this implementation, the circulating-current path control circuit P1 is directly connected with the charge path control circuit P2. In other words, in this example implementation, other circuit elements are not electrically connected (e.g., are excluded) between the circulating-current path control circuit P1 and the charge path control circuit P2. In some implementations, however, a sensing element (e.g., a current-sensing resistor) can be included between the circulating-current path control circuit P1 and the charge path control circuit P2. The charge path control circuit P2 is electrically connected between the switch circuit 120 (and the switch device SW) and a ground terminal GT. The circulating-current path control circuit P1 and the charge path control circuit P2 can be controlled by the control circuit 110.

In this implementations, the circulating-current path control circuit P1 can be referred as a high-side device because of the relative orientation of the circulating-current path control circuit P1 with respect to the charge path control circuit P2. That is, the circulating-current path control circuit P1 is coupled to a high side of the charge path control circuit P2. The circulating-current path control circuit P1 can function as a complementary pair with the charge path control circuit P2, e.g., to implement circulating-current control, such as using the approaches illustrated in, for example, FIGS. 9A-12B and described further below.

Activation of a circuit, such as the circulating-current path control circuit P1, the charge path control circuit P2, and/or the switch device SW includes, for example, changing to an activation state or on-state, turning on or shorting across the circuit so that energy may flow across the circuit from one side of the circuit to the other side of the circuit. Deactivation of a circuit includes, for example, changing to a deactivation state or off-state, turning off or blocking by the circuit so that energy may not flow (e.g., may be limited) across the circuit from one side of the circuit to the other side of the circuit.

Under normal operation, the control circuit 110 is configured to trigger charging of the ignition coil 132 using a battery (e.g., a battery at 12 V, 24 V, 48 V, etc.) coupled to the battery terminal VBAT by activating the charge path control circuit P2 and the switch device SW. In some implementations, the charge path control circuit P2 can be activated by the control circuit 110 before the switch device SW is activated by the control circuit 110. After the ignition coil 132 is charged to a threshold level (e.g., a current in a primary winding of the ignition coil 132 reaches a threshold), the control circuit 110 can control the circulating-current path control circuit P1 and the charge path control circuit P2 to maintain charge in the ignition coil 132 in correspondence with one or more limits (e.g., current limits). In some implementations, a current limit used during circulating-current control can be equal to the charging threshold level, and the control circuit 110 can operate the path control circuits P to dither the energy (charge) stored in the ignition coil 132 around that limit. In some implementations, an upper (current) limit and a lower (current) limit can be used, and the control circuit 110 can operate the path control circuits P to maintain the energy (charge) stored in the ignition coil 132 between those limits. These limits will depend on the specific implementation and specific characteristics of the components of the ignition system 100, such as an impedance of the ignition coil 132.

When a spark is to be generated by (in) the spark plug SP, the switch device SW can be rapidly turned off by the control circuit 110 (e.g. in response to a change in a logic state of a command signal from the ECU 140), while the charge path control circuit P2 is maintained in an activated state by the control circuit 110. In some implementations, when a spark is to be generated by the spark plug SP, the switch device SW can be rapidly turned off by the control circuit 110, while the charge path control circuit P2 is turned off with a delay time by the control circuit 110. During spark generation, the circulating-current path control circuit P1 can be controlled by the control circuit 110 to remain in a deactivated state. The ECU 140 can be configured to trigger the timing, via the control circuit 110, of generation of the spark. After spark generation, the control circuit 100 can be configured (e.g., in response to another change in a logic state of the command signal from the ECU 140) to re-charge the ignition coil 132 to the threshold level and/or resume circulating-current control to maintain charge of the ignition coil 132 in accordance with one or more current limits for the specific implementation. Example implementations of operation of the ignition system 100 (as well other ignition systems, such as the ignition system 200) using circulating-current control are described in further detail below.

In some implementations, the charge path control circuit P2 can be used as a as a fuse (e.g., a solid-state fuse) for the ignition system 100 (and the ignition control circuit 150), such as to protect the ignition system 100 from damage due to a short condition. Such a short condition can be detected by the control circuit 110 and can occur, for example, when the ignition coil 132 and/or the switch device SW are shorted. For instance, in response to a short condition, the charge path control circuit P2 can be deactivated by the control circuit 110 to protect the ignition system 100. In some implementations, in response to a short condition, the switch device SW and/or the circulating-current path control circuit P1 can be deactivated in addition to the charge path control circuit P2. For example, in some implementations, in response to a short condition, both the circulating-current path control circuit P1 and the charge path control circuit P2 can be deactivated to protect the ignition system 100. In some implementations, in response to a short condition, both the switch device SW and the charge path control circuit P2 can be deactivated to protect the ignition system 100. In some implementations, in response to a short condition, the switch device SW, the circulating-current path control circuit P1, and the charge path control circuit P2 can be deactivated to protect the ignition system 100.

Figure 2:
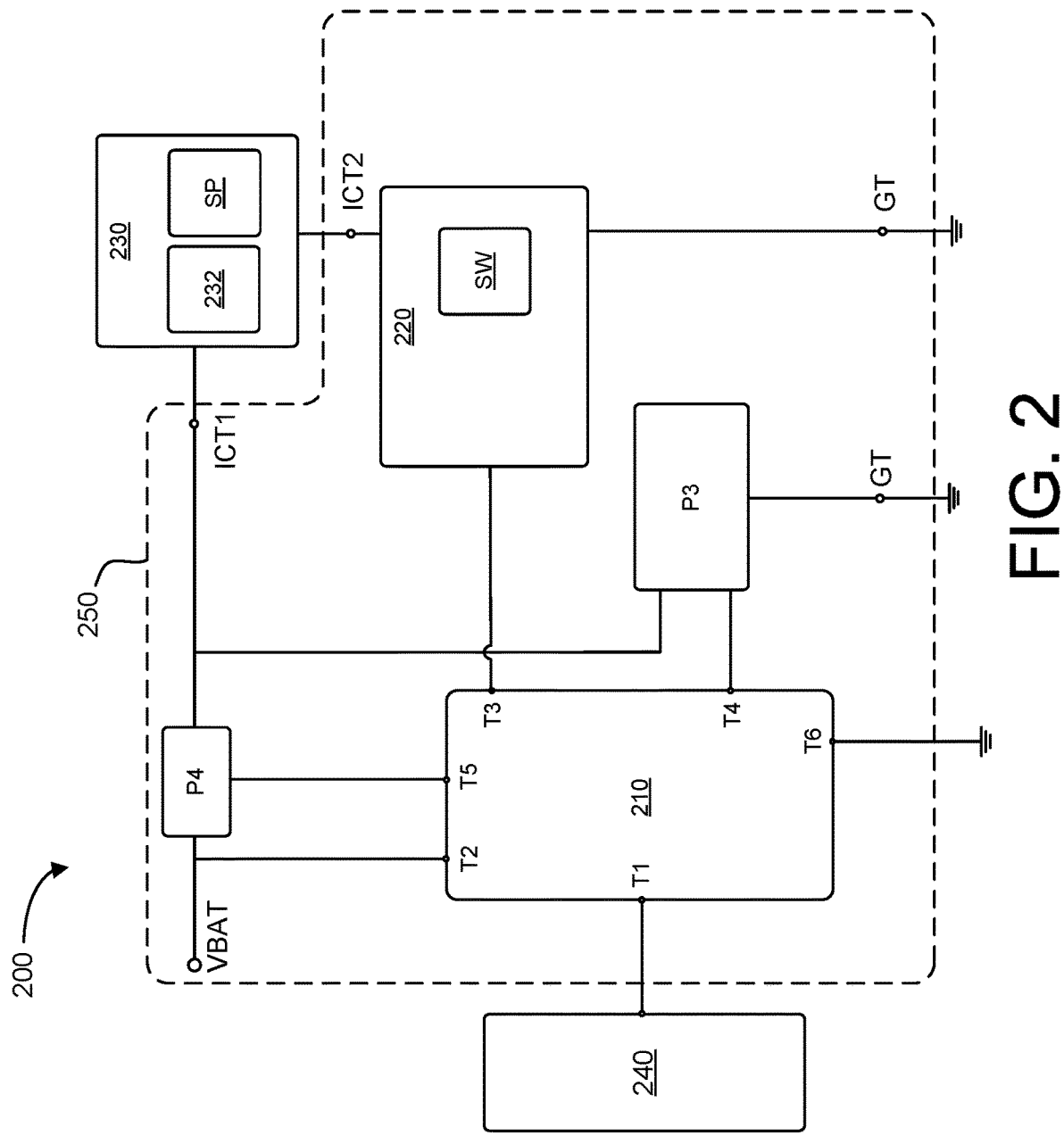
FIG. 2 is a diagram that illustrates another ignition system including an ignition circuit, ECU, and an ignition control circuit.

FIG. 2 is a diagram that illustrates another ignition system 200. While the ignition system 200 is similar to the ignition system 100 in some respects, the implementation of a circulating-current control path and a charge control path in the ignition system 200 differs from the implementation of the ignition system 100. Accordingly, the details of the ignition system 200 provided below describe both the different aspects, as well as the similar aspects of the ignition system 200, as compared to the ignition system 100.

As shown in FIG. 2, the ignition system 200 includes an ignition circuit 230, an ECU 240, and an ignition control circuit 250. The ignition circuit 230 can include at least an ignition coil 232 and a spark plug SP. The ECU 240 can be configured to communicate with the ignition control system 250 to control charging (and discharging) of the ignition coil 232 within the ignition circuit 230. The ignition circuit 230 is electrically connected to the ignition control circuit 250 via ignition circuit terminals ICT1, ICT2.

As shown in FIG. 2, the ignition control circuit 250 includes a control circuit 210, a switch circuit 220, a circulating-current path control circuit P3 (which can also be referred to as a low-side control path circuit in this implementation), and a charge path control circuit P4 (which can also be referred to as a high-side path control circuit in this implementation). As with the path control circuits P1 and P2 of FIG. 1, the circulating-current path control circuit P3 and the charge path control circuit P4 in FIG. 2 can be collectively referred to as path control circuits P. The switch circuit 220 includes a switch device SW, which can be electrically connected to the ignition circuit 230 (and a terminal of the ignition coil 232) via the ignition circuit terminal ICT2. The control circuit 210 is configured to interface with the ECU 240. The switch device SW can be, or can include, a transistor device (e.g., an IGBT, a metal-oxide-semiconductor field-effect transistor (MOSFET) device, etc.).

The path control circuits P of the ignition system 200 are configured to control energy (e.g., current) along various paths within the ignition control circuit 250, and can be used to maintain energy (charge) stored in a primary winding of the ignition coil 232 using circulating-current control, such as using the approaches described herein. In some implementations, the circulating-current path control circuit P3 and the charge path control circuit P4 are configured to control the routing of energy (e.g., during circulating-current control) from the ignition circuit 230 within the ignition control circuit 250.

As shown in FIG. 2, the circulating-current path control circuit P3 is electrically connected between a ground terminal GT and the ICT1 terminal of the ignition circuit 230. In this implementation, the circulating-current path control circuit P3 is directly connected with the ground terminal GT and with the ICT1 terminal. In other words, other circuit elements are not electrically connected (e.g., are excluded) between the ground terminal GT and the circulating-current path control circuit P3, and between the ICT1 terminal and the circulating-current path control circuit P3. In this implementation, the circulating-current path control circuit P3 is parallel to the ignition coil 232 and the switch device SW. In the ignition system 200, the charge path control circuit P4 is electrically connected between a battery terminal VBAT and the ICT1 terminal of the ignition circuit (and to a terminal of the ignition coil 232). In this implementation, the charge path control circuit P4 is directly connected with the VBAT terminal and the ICT1 terminal. In other words, other circuit elements are not electrically connected (e.g., are excluded) between the charge path control circuit P4 and the VBAT terminal, and between the charge path control circuit P4 and the ICT1 terminal. The circulating-current path control circuit P3 and the charge path control circuit P4 can be controlled by the control circuit 210.

In this implementations, the circulating-current path control circuit P3 can be referred as a low-side device because of the relative orientation of the circulating-current path control circuit P3 with respect to the charge path control circuit P4. That is, the circulating-current path control circuit P3 is coupled to a low side of the charge path control circuit P4. The circulating-current path control circuit P3 can function as a complementary pair with the charge path control circuit P4, e.g., to implement circulating-current control, such as using the approaches illustrated in, for example, FIGS. 9A-12B and described further below.

Under normal operation, the control circuit 210 is configured to trigger charging of the ignition coil 232 using a battery (e.g., a battery at 12 V, 14 V, 48 V etc.) coupled to the battery terminal VBAT by activating the charge path control circuit P4 and the switch device SW. In some implementations, the charge path control circuit P4 can be activated by the control circuit 210 before the switch device SW is activated by the control circuit 210. After the ignition coil 232 is charged to a threshold level (e.g., a current in a primary winding of the ignition coil 232 reaches a threshold), the control circuit 210 can control the circulating-current path control circuit P3 and the charge path control circuit P4 to maintain charge in the ignition coil 232 in correspondence with one or more limits (e.g., current limits). In some implementations, a current limit used during circulating-current control can be equal to the charging threshold level, and the control circuit 210 can operate the path control circuits P to dither the energy (charge) stored in the ignition coil 232 around that limit. In some implementations, an upper (current) limit and a lower (current) limit can be used, and the control circuit 210 can operate the path control circuits P to maintain the energy (charge) stored in the ignition coil 232 between those limits. These limits will depend on the specific implementation and specific characteristics of the components of the ignition system 200, such as an impedance of the ignition coil 232.

When a spark is to be generated by (in) the spark plug SP, the switch device SW can be rapidly turned off by the control circuit 210 (e.g. in response to a change in a logic state of a command signal from the ECU 240), while the charge path control circuit P4 is maintained in an activated state by the control circuit 210. In some implementations, when a spark is to be generated by the spark plug SP, the switch device SW can be rapidly turned off by the control circuit 210, while the charge path control circuit P4 is turned off with a delay time by the control circuit 210. During spark generation, the circulating-current path control circuit P3 can be controlled by the control circuit 210 to remain in a deactivated state. The ECU 240 can be configured to trigger the timing, via the control circuit 210, of generation of the spark. After spark generation, the control circuit 200 can be configured (e.g., in response to another change in a logic state of the command signal from the ECU 240) to re-charge the ignition coil 232 to the threshold level and/or resume circulating-current control to maintain charge of the ignition coil 232 in accordance with one or more current limits for the specific implementation. As indicated above with respect to FIG. 1, example implementations of operation of the ignition system 200 using circulating-current control are described in further detail below.

In some implementations, similarly to the charge path control circuit P2 of FIG. 1, the charge path control circuit P4 in FIG. 2 can be used as a fuse (e.g., a solid-state fuse)

for the ignition system 200 (and the ignition control circuit 250), such as to protect the ignition system 200 from damage due to a short condition. Such a short condition can be detected by the control circuit 210 and can occur, for example, when the ignition coil 232 and/or the switch device SW are shorted. For instance, in response to a short condition, the charge path control circuit P4 can be deactivated by the control circuit 210 to protect the ignition system 200. In some implementations, in response to a short condition, the switch device SW and/or the circulating-current path control circuit P3 can be deactivated in addition to the charge path control circuit P4. For example, in some implementations, in response to a short condition, both the circulating-current path control circuit P3 and the charge path control circuit P4 can be deactivated to protect the ignition system 200. In some implementations, in response to a short condition, both the switch device SW and the charge path control circuit P4 can be deactivated to protect the ignition system 200. In some implementations, in response to a short condition, the switch device SW, the circulating-current path control circuit P3, and the charge path control circuit P3 can be deactivated to protect the ignition system 200.

Figure 3A:
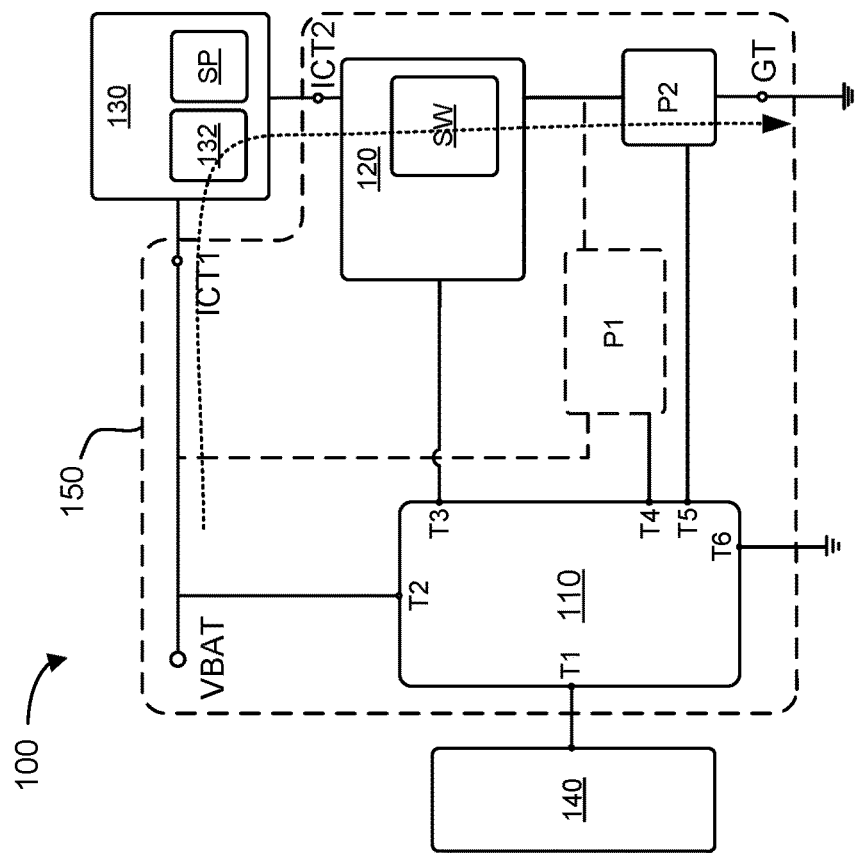
FIGS. 3A and 3B are diagrams that illustrate current paths defined by path control circuits of FIG. 1.
Figure 3B:
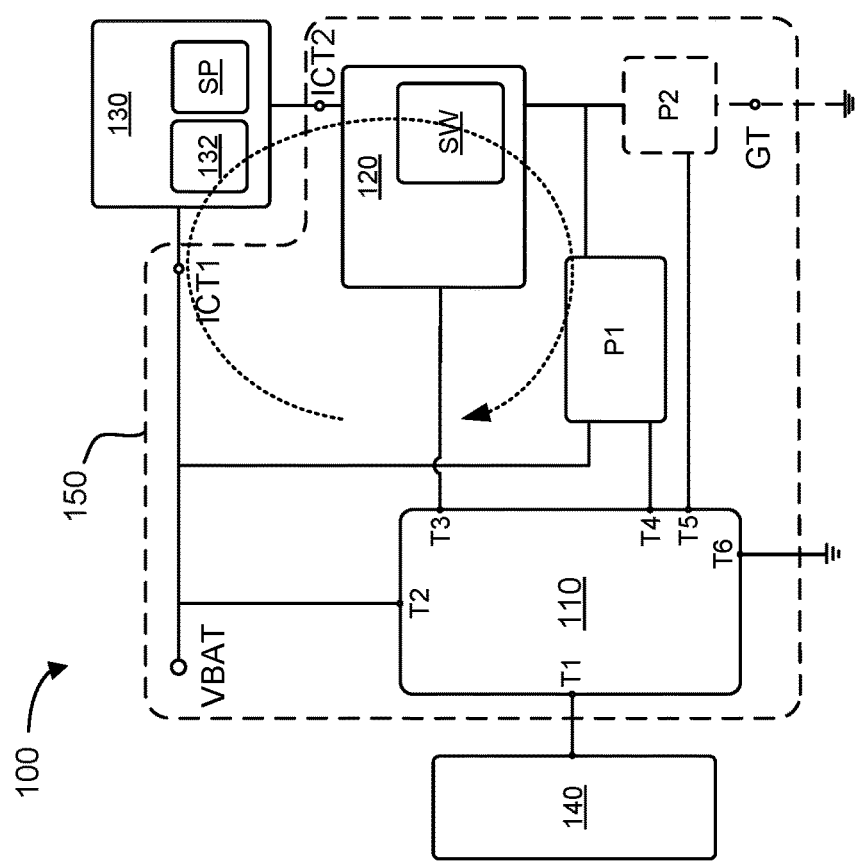

FIGS. 3A and 3B are diagrams that illustrate paths defined by the path control circuits P of the ignition system 100 during circulating-current control. Specifically, FIG. 3A illustrates a looped path (which can be referred to as a circulating-current path configuration) and FIG. 3B illustrates a grounded path (which can be referred to as a charge path configuration). The switching (e.g., alternating switching) described above can be between the looped (circulating-current) path shown in FIG. 3A and the grounded (charge) path shown in FIG. 3B during circulating-current control (e.g., to maintain a threshold current, or charge, in the ignition coil 132).

When in the circulating-current path configuration, the ignition coil 132 may be discharging (e.g., due to a small conduction loss), and when in the grounded path configuration, the ignition coil 132 may be charging (e.g., charging via a battery electrically connected to the battery terminal VBAT). Thus, by switching between these path configurations, the current through the ignition coil 132 may be maintained at (e.g., dithered around) a specified current limit, or maintained between an upper limit and lower limit. For instance, the current in the primary winding of the ignition coil 132 can be maintained about a current set point (or below a current limit, or between upper and lower limits) within a relatively tight range by switching between charging (grounded path) and circulating current (looped path). The current of the primary winding of the ignition coil 132 can oscillate within a range about a current set point (or below a current limit, or between upper and lower limits) when switching between charging (grounded path) and circulating current (looped path). In some implementations, some switching loss may occur when switching between the circulating-current path and the charge path. In some implementations, there may between deactivation of one path and activation of the other path. Switching at a relatively high frequency (e.g., greater than 1 kHz) can help to maintain a tight range around a current limit set point. As discussed further below, in example implementations, switching (complementary switching) between the circulating-current path and the grounded path can be done using a fixed frequency signal with a fixed duty cycle, a variable frequency signal with a fixed duty cycle, a fixed frequency signal with a variable duty cycle, and so forth. The particular approach used will depend on the particular implementation.

As shown in FIG. 3A, the circulating-current path (with direction of current illustrated by a dashed line) is defined when the circulating-current path control circuit P1 is activated and the charge path control circuit P2 is deactivated (by the ignition control circuit 110). The circulating-current path includes the battery terminal VBAT (e.g., the electrical node associated with the VBAT terminal), the ignition circuit terminals ICT1, ICT2 (and the ignition circuit 130 and ignition coil 132), the switch circuit 120 (and switch device SW), and the circulating-current path control circuit P1. The circulating-current path can include, in order, the battery terminal VBAT, the ignition circuit terminals ICT1, ICT2 (and the ignition circuit 130 and ignition coil 132), the switch circuit 120 (and switch device SW), and the circulating-current control circuit P1. In the circulating-current path configuration, the charge path control circuit P2 is bypassed. The circulating-current path in the ignition system 100 also excludes the ground terminal GT. In some implementations, when in the circulating-current path configuration, the switch device SW can be in a saturation mode or state, which can reduce power dissipation in the ignition system 100.

As shown in FIG. 3B, the charge path (with direction of current illustrated by a dashed line) is defined when the circulating-current path control circuit P1 is deactivated and the charge path control circuit P2 is activated (by the ignition control circuit 110). The charge path includes the battery terminal VBAT, the ignition circuit terminals ICT1, ICT2 (and the ignition circuit 130 and ignition coil 132), the switch circuit 120 (and switch device SW), the charge path control circuit P2, and the ground terminal GT. The charge path can include, in order, the battery terminal VBAT, the ignition circuit terminals ICT1, ICT2 (and the ignition circuit 130 and ignition coil 132), the switch circuit 120 (and switch device SW), the charge path control circuit P2, and the ground terminal GT. In the charge path configuration, the circulating-current path control circuit P1 is bypassed. In some implementations, when in the charge path configuration, the switch device SW can be in a saturation mode or state, which can reduce power dissipation in the ignition system 100.

In some implementations, the switching between the charge path configuration and the circulating-current path configuration can be performed with a symmetric timing (e.g., even timing). For example, alternating between the grounded path and the looped path can be performed with symmetric timing during cycles (e.g., same time period for grounded path and the looped path). In some implementations, the switching between the charge path configuration and circulating-current path can be performed with asymmetric timing (e.g., uneven timing). For example, alternating between the charge path and the circulating-current path can be performed with asymmetric timing during cycles (e.g., circulating-current path used for longer periods of time than the charge path). In some implementations, the symmetric or asymmetric handling of the switching between the grounded path and looped path can depend on the elements included in each of the paths (e.g., sizes of MOSFET devices, battery voltage, and/or ignition coil 132 primary inductance). In other words, in some implementations, the timing ratio (e.g., duty ratio) of activation/deactivation of the circulating-current path control circuit P1 and the charge path control circuit P2 can be asymmetric and/or variable. For example, a duration of activation of the circulating-current path control circuit P1 can be greater than a duration of activation of the charge path control circuit P2 based on the current through the ignition coil 132. In such situations, the duration of deactivation of the circulating-current path control circuit P1 can be less than the duration of deactivation of the charge path control circuit P2. As another example, a duration of activation of the circulating-current path control circuit P1 can be less than a duration of activation of the charge path control circuit P2 based on the current through the ignition coil 132. In such situations, the duration of deactivation of the circulating control circuit P1 can be greater than the duration of deactivation of the charge path control circuit P2.

Figure 4A:
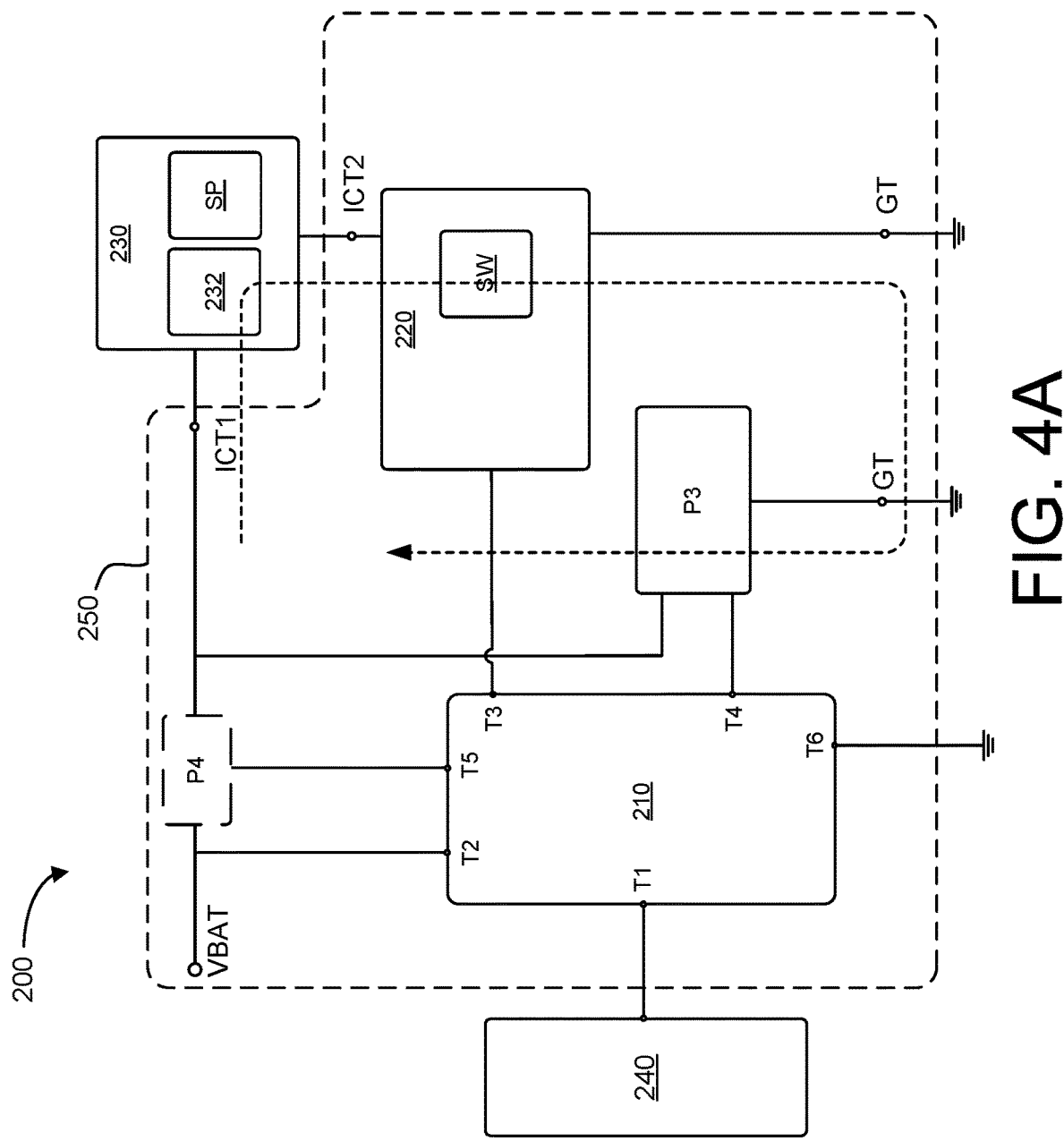
FIGS. 4A and 4B are diagrams that illustrate current paths defined by path control circuits of FIG. 2.
Figure 4B:
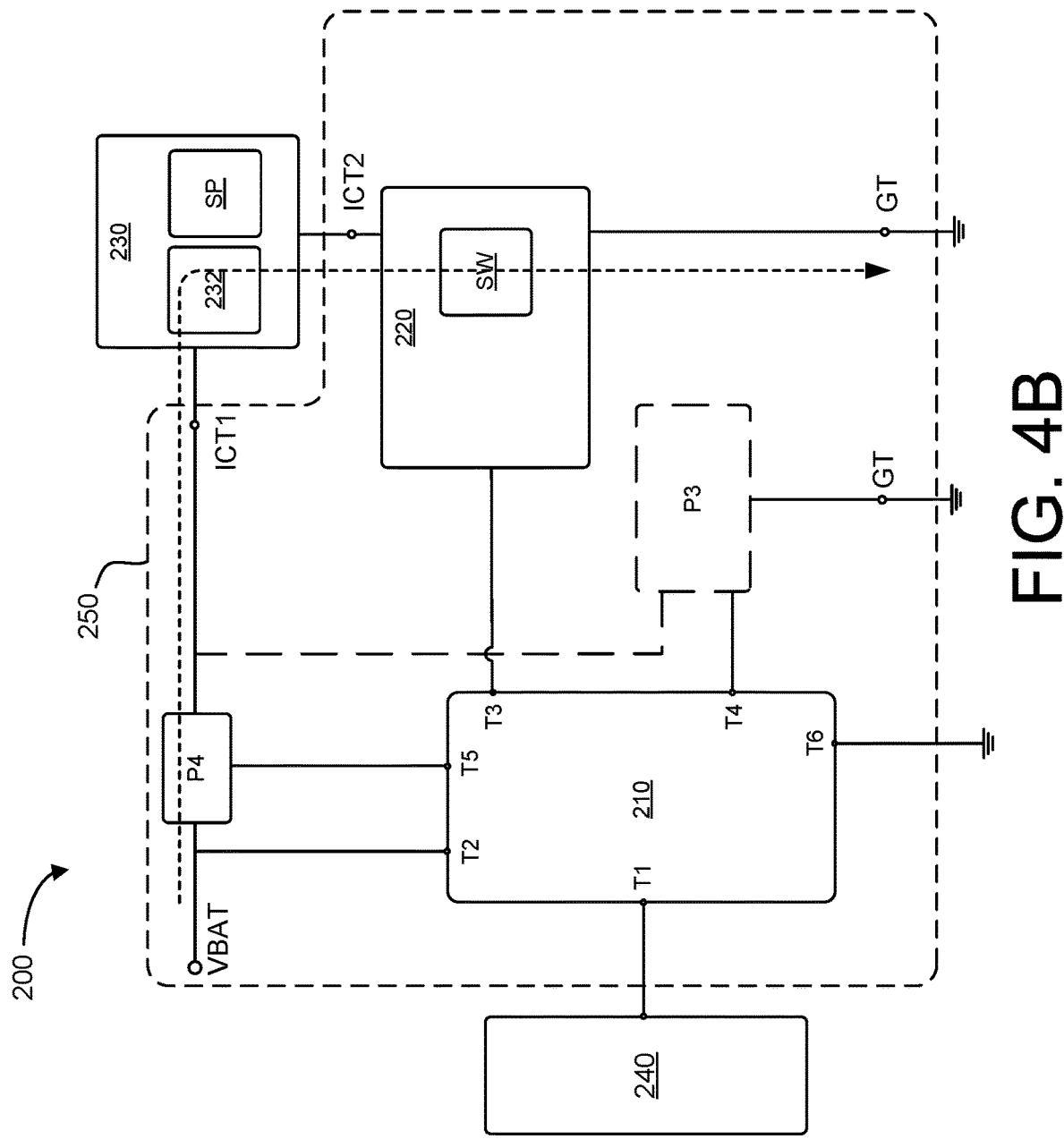

Similar to FIGS. 3A and 3B for the ignition system 100, FIGS. 4A and 4B are diagrams that illustrate paths defined by the path control circuits P of the ignition system 200 during circulating-current control. While the paths in FIGS. 4A and 4B are different than those in FIGS. 3A and 3B, the use of a circulating current-path and a charge path in the ignition system 200 (as well as switching timing between path configurations and applying current limits) to implement circulating-current control is similar to that of the circulating current-path and a charge path of the ignition system 100. Accordingly, for purposes of brevity and clarity, those similar details are not repeated again here with respect to the discussion of FIGS. 4A and 4B.

With respect to the ignition system 200, FIG. 4A illustrates a looped path (which can be referred to as a circulating-current path configuration) and FIG. 4B illustrates a grounded path (which can be referred to as a charge path configuration). The switching (e.g., alternating and complementary switching) described above can be between the looped (circulating-current) path shown in FIG. 4A and the grounded (charge) path shown in FIG. 4B during circulating-current control (e.g., to maintain a threshold current, or charge, in the ignition coil 232).

As shown in FIG. 4A, the circulating-current path (with direction of current illustrated by a dashed line) is defined when the circulating-current path control circuit P3 is activated and the charge path control circuit P4 is deactivated (by the ignition control circuit 210). The circulating-current path includes the ignition circuit terminals ICT1, ICT2 (and the ignition circuit 230 and ignition coil 232), the switch circuit 220 (and switch device SW), the ground terminal GT, and the circulating-current path control circuit P3. The circulating-current path can include, in order, the ignition circuit terminals ICT1, ICT2 (and the ignition circuit 230 and ignition coil 232), the switch circuit 220 (and switch device SW), the ground terminal GT and the circulating-current control circuit P3. In the circulating-current path configuration, the charge path control circuit P4 is bypassed. In some implementations, when in the circulating-current path configuration, the switch device SW can be in a saturation mode or state, which can reduce power dissipation in the ignition system 200.

As shown in FIG. 4B, the charge path (with direction of current illustrated by a dashed line) is defined when the circulating-current path control circuit P4 is deactivated and the charge path control circuit P4 is activated (by the ignition control circuit 210). The charge path includes the battery terminal VBAT, the charge path control circuit P4, the ignition circuit terminals ICT1, ICT2 (and the ignition circuit 230 and ignition coil 232), the switch circuit 220 (and switch device SW), and the ground terminal GT. The charge path can include, in order, the battery terminal VBAT, the charge path control circuit P4, the ignition circuit terminals ICT1, ICT2 (and the ignition circuit 230 and ignition coil 232), the switch circuit 220 (and switch device SW), and the ground terminal GT. In the charge path configuration, the circulating-current path control circuit P3 is bypassed. In some implementations, when in the charge path configuration, the switch device SW can be in a saturation mode or state, which can reduce power dissipation in the ignition system 200.

Figure 5:
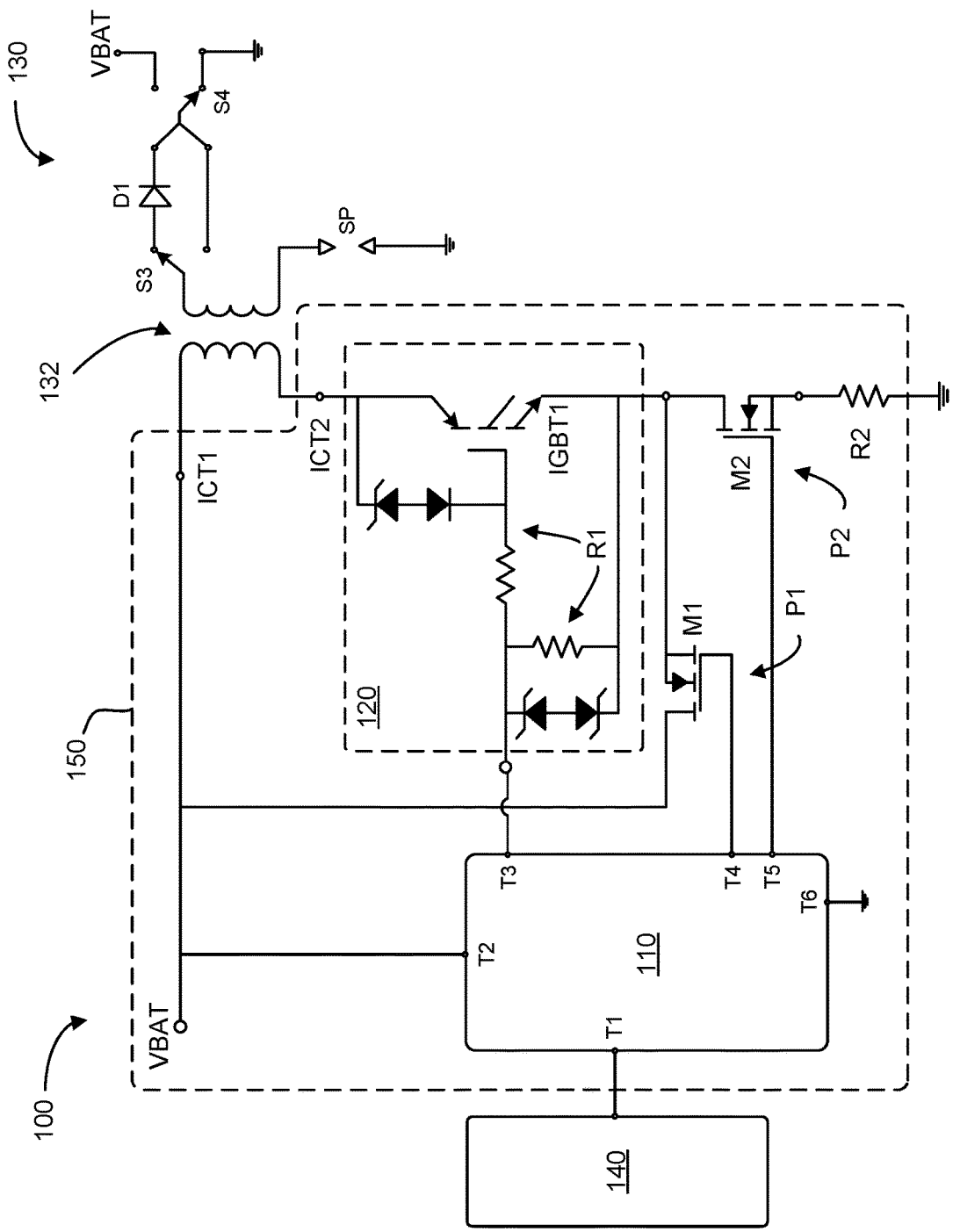
FIG. 5 is a schematic/block diagram that illustrates an example implementation of the ignition system illustrated in FIG. 1.
Figure 6:
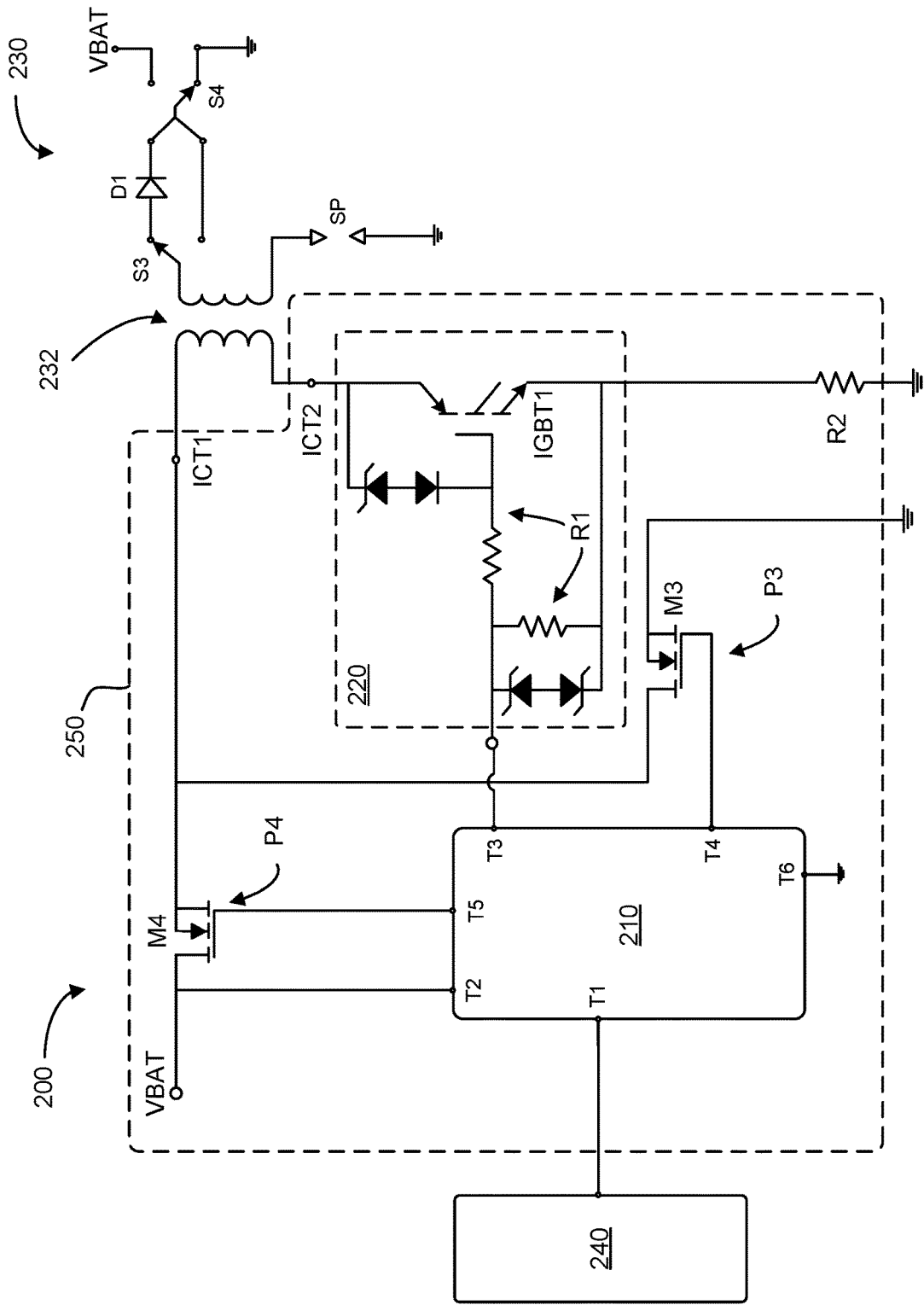
FIG. 6 is a schematic/block diagram that illustrates an example implementation of the ignition system illustrated in FIG. 2.

FIGS. 5 and 6 are schematic/block diagrams that illustrate respective example implementations of the ignition system 100 illustrated in FIG. 1 and the ignition system 200 illustrated in FIG. 2. As the example implementations shown in FIGS. 5 and 6 include a number of similar (and like referenced) elements, for purposes of brevity, they are described together below, and reference to elements of both FIGS. 5 and 6 are made in the following discussion. As shown in FIG. 5, the ignition system 100 includes an implementation of the ignition circuit 130, the engine control unit (ECU) 140, and the ignition control circuit 150. As shown in FIG. 6, the ignition system 200 includes an implementation of the ignition circuit 230, the engine control unit (ECU) 240, and the ignition control circuit 250.

The switch circuits 120 and 220 include, as a switch device (e.g., switch device SW), an IGBT device IGBT1. Because the IGBT device IGBT1 can have a high input impedance, low conduction loss, relatively high switching speed, and/or robustness, the IGBT device IGBT1 can operate (e.g., integrate) well with the ECUs 140 and 240, and integrated circuits (ICs), which are often implemented using complementary metal-oxide semiconductor processes, though in some implementations circuits implemented using bipolar process can be used. The switch circuits 120 and 220 also include a resistor-diode network R1. In some implementations, the resistor-diode network R1 can be excluded. The network R1, and specifically the Zener diodes between ICT2 and the IGBT device IGBT1 gate terminal, can be configured to define a high-voltage clamp for the ignition control circuits 150 and 250.

As shown in FIGS. 5 and 6, the ignition circuits 130 and 230 include, respectively, an ignition coil 132 and an ignition coil 232 (e.g., magnetic-core transformers). The ignition circuits 130 and 230 also each include a spark plug SP. In the implementations of FIGS. 5 and 6, the ignition circuits 130 and 230 are illustrated with a high voltage diode D1 that is connected to a secondary winding of the respective ignition coils 132 and 232. The diode D1 can be used to suppress transient voltage spikes in the secondary winding of the ignition coils 132 and 232 at the beginning of a charging period of the ignition coils 132 and 232, and/or when beginning circulating-current control. In some implementations, the diode D1 can be omitted and/or other transient suppression approaches can be used.

In the implementation of FIG. 5, the circulating-current path control circuit P1 is a transistor device M1, and the charge path control circuit P2 is a transistor device M2. In the implementation of FIG. 6, the circulating-current path control circuit P3 is a transistor device M3, and the charge path control circuit P4 is a transistor device M4. Specifically, in these implementations, the path control circuits P1, P2, P3 and P4 can be N-type MOSFETs (NMOS) devices M1, M2, M3 and M4, respectively. In some implementations, the circulating-current path control circuits P1 and P3 can be implemented as, or can include, respective diodes.

In some implementations, the transistor devices M1 and M2, as well as the transistor devices M3 and M4, can be the same size (e.g., same width and/or same length). In some implementations, the transistor device M1 and the transistor device M2, as well as the transistor devices M3 and M4, can be different sizes (e.g., different width and/or different length).

As shown in FIGS. 5 and 6 (as well as in FIGS. 1 and 2), the control circuits 110 and 210 (e.g., control integrated circuits (ICs)) include a plurality of terminals. For example, the control ICs 110 and 210 in these implementations include terminals T1 through T6. These terminals T1 through T6 can each be a single terminal or can include respective multiple terminals, depending on the particular implementation and/or the particular terminal. For instance, in the control circuits 110 and 210, the terminal T1 can include multiple terminals that are coupled with a respective engine control unit (ECU) 140 or 240 to receive and/or send signals to the ECUs 140 and 240. The ECUs 140 and 240 may communicate a signal (or signals), respectively, to the control circuits 110 and 210 via the terminal T1 (e.g., on a first terminal of the multiple terminals of terminal T1) that is used to control charging of the ignition coils 132 and 232 (including circulating-current control) and firing of the spark plugs SP.

In an implementation, terminal T1 can be used to communicate one or more other signals, from the ignition control circuits 150 and 250 to the respective ECUs 140 and 240, such as signals that indicate occurrence of an abnormal operating condition, and/or to indicate that the ignition control circuits 150 and 250 are operating normally, or as expected, and/or to indicate specific operating conditions or parameters, such as primary current, of the ignition systems 100 and 200. In some implementations, the terminal T1 could be a single bi-directional terminal configured to both send and receive signals, such as the signals described herein.

In FIGS. 5 and 6, the terminal T2 of the control circuits 110 and 210 can be a power supply terminal that receives a battery voltage ($V_{bat}$) on the terminal VBAT, such as from a battery (e.g., a battery of a vehicle) in which the ignition control circuits 150 and 250 are implemented. In the control circuits 110 and 120, the terminal T3 may be used to provide a signal that controls (e.g., drives, triggers) a gate of the IGBT device IGBT1 (e.g. to control, at least, charging of the ignition coils 132 and 232, and firing of the spark plugs SP).

As shown in the example implementations of FIGS. 5 and 6, a switch circuit S4 can be used to switch between the battery voltage VBAT and electrical ground. Likewise, a switch circuit S3 can be used to switch the diode D1 in and out of the charging/discharging circuit of the ignition coils 132 and 232 (e.g., to remove the diode from the charging/discharging circuit). The switch circuits S3 and S4 can be used to configure the charging/discharging circuit of the ignition circuits 130 and 230 for a particular implementation. The switches S3 and S4 illustrate various configurations of the illustrated circuits. In some implementations, the switches may not be present in the ignition circuits.

The terminals T4 and T5 can be terminals through which the circulating-current path control circuits P1 and P3 (e.g., NMOS devices M1 and M3) and the charge path control circuits P2 and P4 (e.g., NMOS devices M2 and M4) are controlled (e.g., driven, triggered). The terminal T6 of the control circuits 110 and 210 can be a ground terminal that is connected with an electrical ground for the control circuits 110 and 210.

The ignition coils 132 and 232 have primary coils electrically coupled to the ignition circuit terminals ICT1 and ICT2, and the ignition coils 232 have secondary coils electrically coupled to the switch circuits S3 and the spark plugs SP. In some ignition circuit implementations, a ratio of a number of windings in the primary coil to a number of windings in the secondary coil can vary. For example, the number of windings in the primary coil can be less than the number of windings in the secondary coil (e.g., step-up). In still some implementations, the number of windings in the primary coil can be equal to (e.g., substantially equal to) the number of windings in the secondary coil.

A current in a primary winding (e.g., an inductor) of the ignition coils 132 and 232 (e.g., a magnetic core transformer), which can be referred to as a primary current, can be dependent on a variety of components and factors. In the ignition control circuits 150 and 250, changes in the primary current (as compared to the primary current expected during normal operation) can provide various indications of operational state of the ignition systems 100 and 200, which indications can be used by the control circuits 110 and 210 when controlling operation of the ignition control circuits 150 and 250, including implementing circulating-current control, as described herein.

The ignition control circuits 150 and 250 of FIGS. 5 and 6 also each include a resistor R2, which can be referred to as a sense resistor. The resistors R2 can be used, based on a time varying voltage across the resistor R2, to determine a current in the ignition coils 132 or 232, and also to detect changes in a slope of the primary current (e.g., for purposes of implementing circulating-current control). Although not shown in FIGS. 5 and 6, the control circuits 110 and 210 can be coupled to the resistor R2 (e.g., a terminal of the resistor R2) and can be configured to detect (sense) the primary current. For example, a terminal (not shown) of the control circuits 110 and 210 can be configured to receive (or measure) a voltage, or voltage signal, across the resistor R2 of the ignition control circuit 150 or 250. The voltage across the resistor R2 over each ignition cycle, which can be referred to as a voltage sense signal, can be used for, e.g., current slope detection for a current through a primary winding of the ignition coil 132. In some implementations, other circuit elements (in addition to the sense resistor R2, or instead of the sense resistor R2) can be used to determine the primary current through ignition coils 132 and 232. For instance, current sensing through the primary windings of the ignition coils 132 and 232 can be used as feedback (e.g., as a feedback signal) to trigger switching (e.g., alternative and complementary switching) between the circulating-current path control circuits P1 and P3 and their respective charge path control circuits P2 and P4, e.g., at a specified frequency and/or timing ratio (or duty ratio) of activation/deactivation (during circulating-current control).

Figure 7:
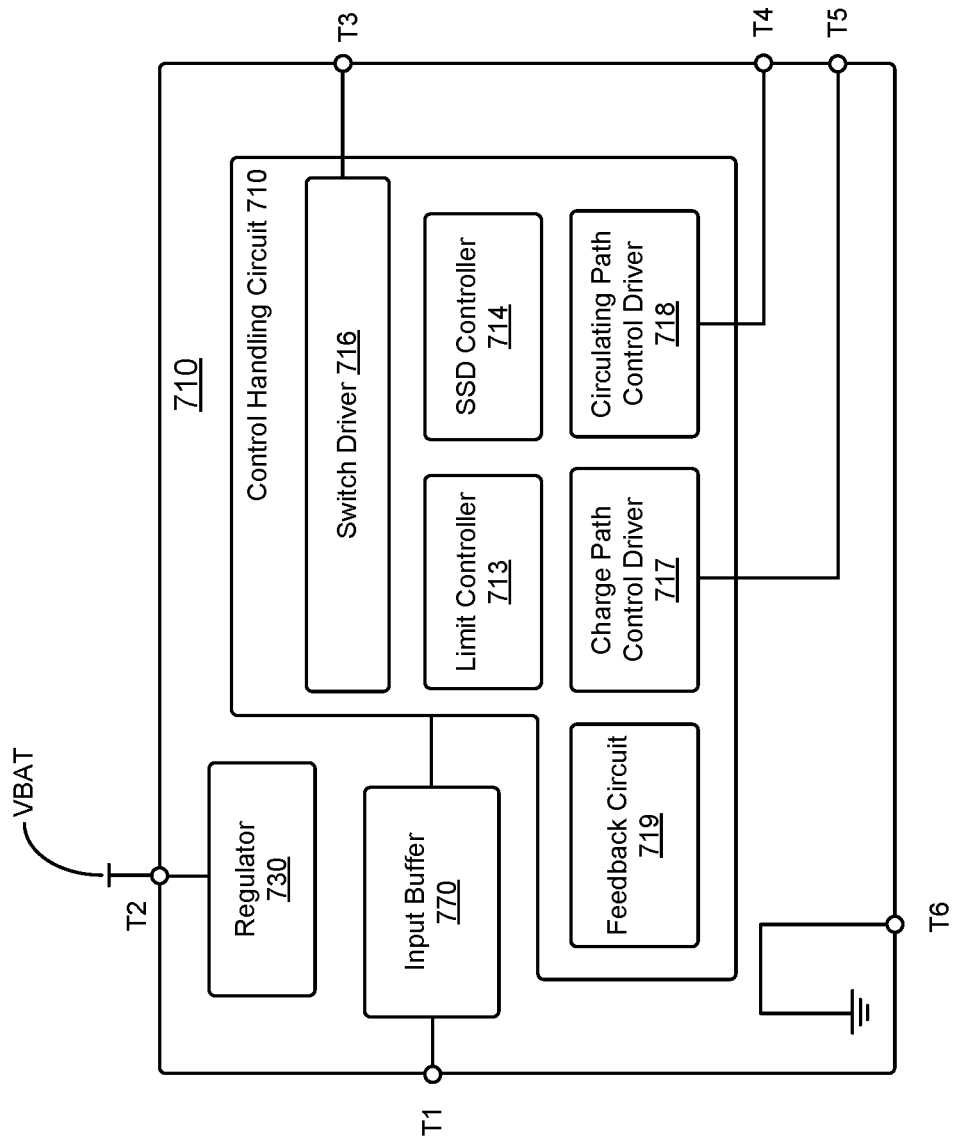
FIG. 7 is a diagram that illustrates an example implementation of a control circuit that can be used to implement the control circuits of FIGS. 1, 2, 5 and 6.

FIG. 7 is a diagram that illustrates an example implementation of a control circuit 710. In some implementations, the control circuit 710 can be used to implement the control circuits 110 and 210 of the implementations shown in, at least, FIGS. 1 and 2. As shown in FIG. 7, the control circuit 710 includes a control handling circuit 710, an input buffer 720, and a regulator 730.

The control handling circuit 710 includes a circulating path control driver 717 and a charge path control driver 718 that are configured to, for example, control (e.g., drive, trigger), respectively, the circulating control path circuits P1 and P3 and the charge path control circuits P2 and P4 shown in at least FIGS. 1 and 2 (e.g., via the terminals T4 and T5). The control handling circuit 710 includes a switch driver 716 configured to, for example, drive the switch device SW shown in at least FIGS. 1 and 2 (via terminal T3).

In this implementation, the control handling circuit 710 includes a limit controller 713 and a soft-shutdown (SSD) controller 714. The limit controller 713 can be configured to implement, in conjunction with, at least, the switch driver 716, the circulating path control driver 717, and the charge path control driver 718, one or more current limits for circulating-current control in an associated ignition system, such as the ignition systems 100 and 200.

In some implementations, in response to detection of certain undesired operating conditions in an associated ignition system (e.g., an over dwell-time condition) using the control handling circuit 710, the SSD controller 714 can be configured to implement an SSD protection mode by controlling, for example, the switch device SW, the circulating-current path control circuit (e.g., P1 or P3), the charge path control circuit (e.g., P2 or P4) using, respectively, the switch driver 716, the circulating path control driver 718, and the charge path control driver 717.

As shown in FIG. 7, the control handling circuit 710 includes a feedback circuit 719 configured to use a value (e.g., a representation) of energy (e.g., current) through the ignition coil 132 or 232 as feedback (e.g., as a feedback signal). The feedback can be used by the feedback circuit 719 to trigger switching (e.g., alternate and complementary switching) between the circulating path control circuits P1 and P3 and the charge path control circuits P2 and P4 at a specified frequency and/or timing ratio (e.g., duty ratio) of activation/deactivation (during circulating-current control).

The input buffer 770 of the ignition control circuit 710 in FIG. 7 can be configured to receive at least one command signal from, for example, the ECU 140 or 240, e.g., a signal to control charging of the ignition coil 132 or 232 including circulating-current control, and firing of the spark plug SP. The at least one command signal can be used in the ignition control circuit 710 to trigger control of a gate terminal of the IGBT device IGBT1 to affect charging of the ignition coil 132 and 232, circulating-current control and firing of the spark plug SP.

The voltage regulator 730, when implemented in the ignition control circuit 710, can receive the battery voltage VBAT and, based on that battery voltage, provide reference voltages, direct-current voltages, etc. used in the ignition control circuits 110 and 210 of FIGS. 5 and 6. For example, in some implementations, the regulator 730 can be a linear voltage regulator. In some implementations, the regulator 730 can take other forms.

FIG. 8 is flowchart that illustrates a method 800 of operating an ignition system and an ignition control circuit with circulating-current control, such as using the approaches described herein. In some implementations, the method 800 can be implemented in the ignition systems 100 or 200. For purposes of illustration, the method 800 will be described with further reference to the ignition system 100 of FIGS. 1 and 5. However, in some implementations, the method 800 of FIG. 8 can also be implemented in the ignition system 200 of FIGS. 2 and 6, as well as in ignition systems having other configurations.

As shown in FIG. 8, the method 800, when implemented in the ignition system 100, at block 810 includes enabling the charge path control circuit P2 and the switch circuit 120 to charge a primary winding of the ignition coil 132 of the ignition circuit 130. At block 810, the primary winding can be charged until a threshold current (as detected by the control circuit 110) is reached in the primary winding. As described above, in the ignition system 100, the charge path control circuit P2, the primary winding of the ignition coil 132 and the switch circuit 120 can be electrically coupled in series (e.g., with the battery terminal VBAT).

At block 820, the method 800 includes, after reaching the threshold current in the primary winding, maintaining a current in the primary winding of the ignition coil 132 in correspondence with a current limit (e.g., at least one current limit). The primary current can be maintained in the ignition coil 132 using circulating-current control, by alternatively activating and deactivating the charge path control circuit P2 complementary to alternative activation and deactivation of the circulating-current path control circuit P1. As shown in FIGS. 1 and 5, and as discussed above, the circulating-current path control circuit P1, the primary winding and the switch circuit 120 can be electrically coupled in series in a looped path.

At block 830, the method 800 includes, during the maintaining of the current in the primary winding of the ignition coil 132, initiating a spark in the spark plug SP included in the ignition circuit 130. In some implementations, initiating the spark can include controlling an amount of energy delivered from the primary winding to a secondary winding of the ignition coil 132. The amount of energy can be controlled by the controller 110 (and the ECU 140) by regulating (controlling, etc.) an amount of time switch circuit 120 and or the charge path control circuit P2 are deactivated when initiating the spark in the spark plug SP. In some implementations, this amount of time can be determined by the control circuit 110 and/or the ECU 140 based on an amount of energy (charge, etc.) stored in the primary winding of the ignition coil 132 when spark initiation is requested (e.g., using a command signal from the ECU 140). In some implementations, the amount of stored energy can be determined based on the primary current of the ignition coil, which can be sensed, for example, by the control circuit 110 by monitoring a time varying voltage across the sense resistor R2 shown in FIG. 5. In some implementations, after the spark event is completed (e.g., a desired amount of energy has been delivered to the secondary winding of the ignition coil 132), the switch circuit 120 and the charge path control circuit P2 can be activated (re-activated) to again charge (re-charge) the ignition coil 132 to the threshold current level (such as at block 810), and then ignition control circuit 150 can resume circulating-current control to maintain the primary current in the ignition coil 132 in accordance with one or more current limits (such as at block 820), such as dithering about a single current limit set point, maintaining the primary current between an upper limit and a lower limit, etc.

FIGS. 9A-9D are timing diagrams that schematically illustrate primary current in an ignition coil versus time for example implementations of ignition systems, such as the ignition systems 100 and 200, using circulating-current control. In the diagrams of FIGS. 9A-9D, time is illustrated on the x-axis and primary current (of an ignition coil) is illustrated on the y-axis. For purposes of illustration, each of the diagrams of FIGS. 9A-9D will be described with further reference to the ignition system 100 of FIGS. 1 and 5. However, in some implementations, the diagrams of FIGS. 9A-9D can also correspond with operation of the ignition system 200 of FIGS. 2 and 6 using circulating-current control, as well as with the operation of ignition systems having other configurations and implementing circulating-control, such as using the approaches described herein.

Referring to FIG. 9A, at a time Tm0, the control circuit 110 can receive an indication (via a change in a logic level of a command signal received from the ECU 140 on terminal T1) to begin operation of the ignition control circuit 150 and the ignition circuit 130. In esponse to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130. The primary current in FIG. 9A is illustrated by trace 910.

At time Tm1 in FIG. 9A, an initial charging threshold for the ignition coil 132 can be reached, and the ignition control circuit 150 can begin operating using circulating-current control to maintain the primary current of the ignition coil 132 between a lower current limit CL1 and an upper current limit CL2. In this example, the initial charging threshold and the upper current limit CL2 can be equal. In other implementations, such as illustrated in FIG. 9B, a single current limit (e.g., single set point) can be used, and the primary current of the ignition coil 132 can be dithered about that single limit. In such implementations, the initial charging threshold can be greater than the single current limit.

In FIG. 9A, between time Tm1 and Tm2, the ignition system 100 can be operated (e.g., by the control circuit 110) in a circulating-current control mode, to maintain the primary current in accordance with (between) the current limits CL1 and CL2. As discussed herein, circulating-current control can be implemented in the ignition system 100 by alternatively and complementarily activating and deactivating the circulating-current path control circuit P1 and the charge path control circuit P2 using appropriate timing, such as in accordance with the timing approaches described herein.

At time Tm2 in FIG. 9A, the control circuit 110 can receive an indication (via another change in the logic level of the command signal received from the ECU 140) that a spark event is to be initiated in the spark plug SP. In response to the indication at time Tm2, the control circuit 110 can deactivate the switch circuit 120 and/or the charge path control circuit P2. This deactivation of the switch circuit 120 and/or the charge path control circuit P2 will cause the primary current to rapidly drop to, or near, zero and cause a resulting spike in a voltage across the primary winding. This spike in voltage will result in energy stored in the primary winding of the ignition coil 130 being transferred to the secondary winding of the ignition coil 130 and further cause a spark event in the spark plug SP. In some implementations, the control circuit 110 can also, in response to the indication at time Tm2, deactivate the circulating-current path control circuit P1.

At time Tm3 in FIG. 9A, the control circuit 110 can receive an indication (via yet another change in the logic level of the command signal received from the ECU 140) that a spark event is to be ended. In response to the indication at time Tm3, the control circuit 110 can activate the charge path control circuit P2 and the switch circuit 120 to re-charge the ignition coil to the initial charging threshold. As can be seen in FIG. 9A at time Tm3, in this implementation, all (nearly all) of the energy stored in the primary winding of the ignition coil at time Tm2 has been dissipated during the spark event (between time Tm2 and time Tm3), which is illustrated by a zero primary current at time Tm3.

At time Tm4 in FIG. 9A, circulating-current control, such as described herein, can resume once the ignition coil 130 has been charged to the initial charging threshold (e.g., as determined by the control circuit 110 from the primary current).

Referring to FIG. 9B (as in FIG. 9A), at a time Tm0 (as in FIG. 9A), the control circuit 110 can receive an indication (via a change in a logic level of a command signal received from the ECU 140 on terminal T1) to begin operation of the ignition control circuit 150 and the ignition circuit 130. In response to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130. The primary current in FIG. 9B is illustrated by trace 920.

At time Tm1 in FIG. 9B (as at time Tm1 in FIG. 9A), an initial charging threshold for the ignition coil 132 can be reached, and the ignition control circuit 150 can begin operating using circulating-current control to maintain the primary current of the ignition coil 132 about a single current limit (set point) CL (e.g., by dithering the primary current about the limit CL). In this example, the initial charging threshold can be greater than the current limit CL. In other implementations, such as illustrated in FIG. 9A, an upper current limit and a lower current limit can be used.

In FIG. 9B, between time Tm1 and time Tm2, the ignition system 100 can be operated (e.g., by the control circuit 110) in a circulating-current control mode, to maintain the primary current in accordance with the current limit CL. As discussed herein, circulating-current control can be implemented in the ignition system 100 by alternatively and complementarily activating and deactivating the circulating-current path control circuit P1 and the charge path control circuit P2 using appropriate timing, such as in accordance with the timing approaches described herein.

At time Tm2 in FIG. 9B (as in FIG. 9A), the control circuit 110 can receive an indication (via another change in the logic level of the command signal received from the ECU 140) that a spark event is to be initiated in the spark plug SP. In response to the indication at time Tm2, the control circuit 110 can deactivate the switch circuit 120 and/or the charge path control circuit P2. This deactivation of the switch circuit 120 and/or the charge path control circuit P2 will cause the primary current to rapidly drop to, or near, zero and cause a resulting spike in a voltage across the primary winding. As also discussed above with respect to FIG. 9A, this spike in voltage will result in energy stored in the primary winding of the ignition coil 130 being transferred to the secondary winding of the ignition coil 130 and further cause a spark event in the spark plug SP. In some implementations, the control circuit 110 can also, in response to the indication at time Tm2, deactivate the circulating-current path control circuit P1.

At time Tm3 in FIG. 9B, the control circuit 110 can receive an indication (via yet another change in the logic level of the command signal received from the ECU 140) that a spark event is to be ended. In response to the indication at time Tm3, the control circuit 110 can activate the charge path control circuit P2 and the switch circuit 120 to re-charge the ignition coil to the initial charging threshold. As can be seen in FIG. 9B, at time Tm3 (illustrated by a non-zero primary current), in this implementation, only a portion of the energy stored in the primary winding of the ignition coil at time Tm2 has been dissipated during the spark event (between time Tm2 and time Tm3). The amount of energy that is dissipated in between Tm2 and Tm3 in FIG. 9B will depend on, e.g., the time elapsed between Tm2 and Tm3, an amount of energy stored in the ignition coil 132 at time Tm2, impedance of the ignition coil 132, etc.

At time Tm4 in FIG. 9B (similar to FIG. 9A), circulating-current control, such as described herein, can resume once the ignition coil 130 has been charged to the initial charging threshold (e.g., as determined by the control circuit 110 from the primary current).

Referring to FIG. 9C, at a time Tm0 (as in FIGS. 9A and 9B), the control circuit 110 can receive an indication (via a change in a logic level of a command signal received from the ECU 140 on terminal T1) to begin operation of the ignition control circuit 150 and the ignition circuit 130. In response to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130. The primary current in FIG. 9C is illustrated by trace 930.

At time Tm1 in FIG. 9C, an initial charging threshold for the ignition coil 132 can be reached, and the ignition control circuit 150 can begin operating using circulating-current control to maintain the primary current of the ignition coil 132 in accordance with one or more current limits, such as using the approaches described herein.

In FIG. 9C, between time Tm1 and time Tm2, the ignition system 100 can be operated (e.g., by the control circuit 110) in a circulating-current control mode, to maintain the primary current in accordance with the one or more current limits. As discussed herein, circulating-current control can be implemented in the ignition system 100 by alternatively and complementarily activating and deactivating the circulating-current path control circuit P1 and the charge path control circuit P2 using appropriate timing, such as in accordance with the timing approaches described herein.

At time Tm2 in FIG. 9C (as in FIGS. 9A and 9B), the control circuit 110 can receive an indication (via another change in the logic level of the command signal received from the ECU 140) that a spark event is to be initiated in the spark plug SP. In response to the indication at time Tm2, the control circuit 110 can deactivate the switch circuit 120 and/or the charge path control circuit P2. This deactivation of the switch circuit 120 and/or the charge path control circuit P2 will cause the primary current to rapidly drop to, or near, zero and cause a resulting spike in a voltage across the primary winding. As also discussed above with respect to FIGS. 9A and 9B, this spike in voltage will result in energy stored in the primary winding of the ignition coil 130 being transferred to the secondary winding of the ignition coil 130 and further cause a spark event in the spark plug SP. In some implementations, the control circuit 110 can also, in response to the indication at time Tm2, deactivate the circulating-current path control circuit P1.

At time Tm3 in FIG. 9C, the control circuit 110 can receive an indication (via yet another change in the logic level of the command signal received from the ECU 140) that a spark event is to be ended. In response to the indication at time Tm3, the control circuit 110 can activate the charge path control circuit P2 and the switch circuit 120 to re-charge the ignition coil to the initial charging threshold. As can be seen in FIG. 9C at time Tm3 (illustrated by a non-zero primary current), in this implementation (similar to the example of FIG. 9B), only a portion of the energy stored in the primary winding of the ignition coil at time Tm2 has been dissipated during the spark event (between time Tm2 and time Tm3). The amount of energy that is dissipated between Tm2 and Tm3 in FIG. 9C (as in FIG. 9B) will depend on, e.g., the time elapsed between Tm2 and Tm3, an amount of energy stored in the ignition coil 132 at time Tm2, impedance of the ignition coil 132, etc.

At time Tm4 in FIG. 9C, another spark event can be initiated (e.g., by the command signal from the ECU) and ended at time Tm5 (e.g., by the command signal). Similarly, another (sequential) spark event can occur, as shown in FIG. 9C, between time Tm6 and time Tm7. The spark events of FIG. 9C can be referred to as multi-spark events (sequential spark events, etc.). The approach illustrated in FIG. 9C can be implemented by an ignition system, e.g., in a vehicle (or at operating condition) requiring more sparking energy (e.g., than a single sparking event) and/or a longer burning time to completely combust the fuel air mixture. By controlling the amount of energy used for each spark event in FIG. 9C (e.g., not fully discharging the ignition coil 132 for each spark event) and re-charging the ignition coil 132 after (directly after) each spark event, sufficient energy for generating the sequential, multi-spark events of FIG. 9C can be available (stored) in the ignition coil 132 at the start of each of the spark events.

Referring to FIG. 9D, at a time Tm0 (as in FIGS. 9A-9C), the control circuit 110 can receive an indication (via a change in a logic level of a command signal received from the ECU 140 on terminal T1) to begin operation of the ignition control circuit 150 and the ignition circuit 130. In response to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130. The primary current in FIG. 9C is illustrated by trace 940.

At time Tm1 in FIG. 9D, an initial charging threshold for the ignition coil 132 can be reached, and the ignition control circuit 150 can begin operating using circulating-current control to maintain the primary current of the ignition coil 132 in accordance with one or more current limits, such as using the approaches described herein.

In FIG. 9D, between time Tm1 and time Tm2, the ignition system 100 can be operated (e.g., by the control circuit 110) in a circulating-current control mode, to maintain the primary current in accordance with the one or more current limits. As discussed herein, circulating-current control can be implemented in the ignition system 100 by alternatively and complementarily activating and deactivating the circulating-current path control circuit P1 and the charge path control circuit P2 using appropriate timing, such as in accordance with the timing approaches described herein.

At time Tm2 in FIG. 9D, the control circuit 110 can receive an indication (e.g., from the ECU 140), or make a determination (e.g., based on a sensed current in the ignition system 100) that a soft shutdown (SSD) mode (operation, process, etc.) should be implemented in the ignition system 100. In response to the indication (or determination) at time Tm2, the control circuit 110 can deactivate the charge path control circuit P2, activate the circulating-current path control circuit P1 and activate the switch circuit 120, causing the circulating-current (looped) path shown in FIG. 3A to conduct current using energy stored in the ignition coil 132. Then, as shown in FIG. 9D between time Tm2 and Tm3, the primary current can slowly decay (attenuate, decrease, etc.) to zero (e.g., at time Tm3) due to conduction losses in the circulating-current path (FIG. 3A), without causing a large voltage spike in the secondary winding of the ignition coil 132 of producing an undesired spark event, that could damage one or more components of the ignition system 100.

At time Tm4 in FIG. 9D (after completion of SSD), the control circuit 110 can receive an indication (e.g., via a change in the logic level of the command signal received from the ECU 140) that a operation of the ignition system 100 is to resume. In response to the indication at time Tm4, the control circuit 110 can activate the charge path control circuit P2 and the switch circuit 120 to re-charge the ignition coil to the initial charging threshold, and circulating-current control can resume at time Tm5 in FIG. 9D.

Figure 10:
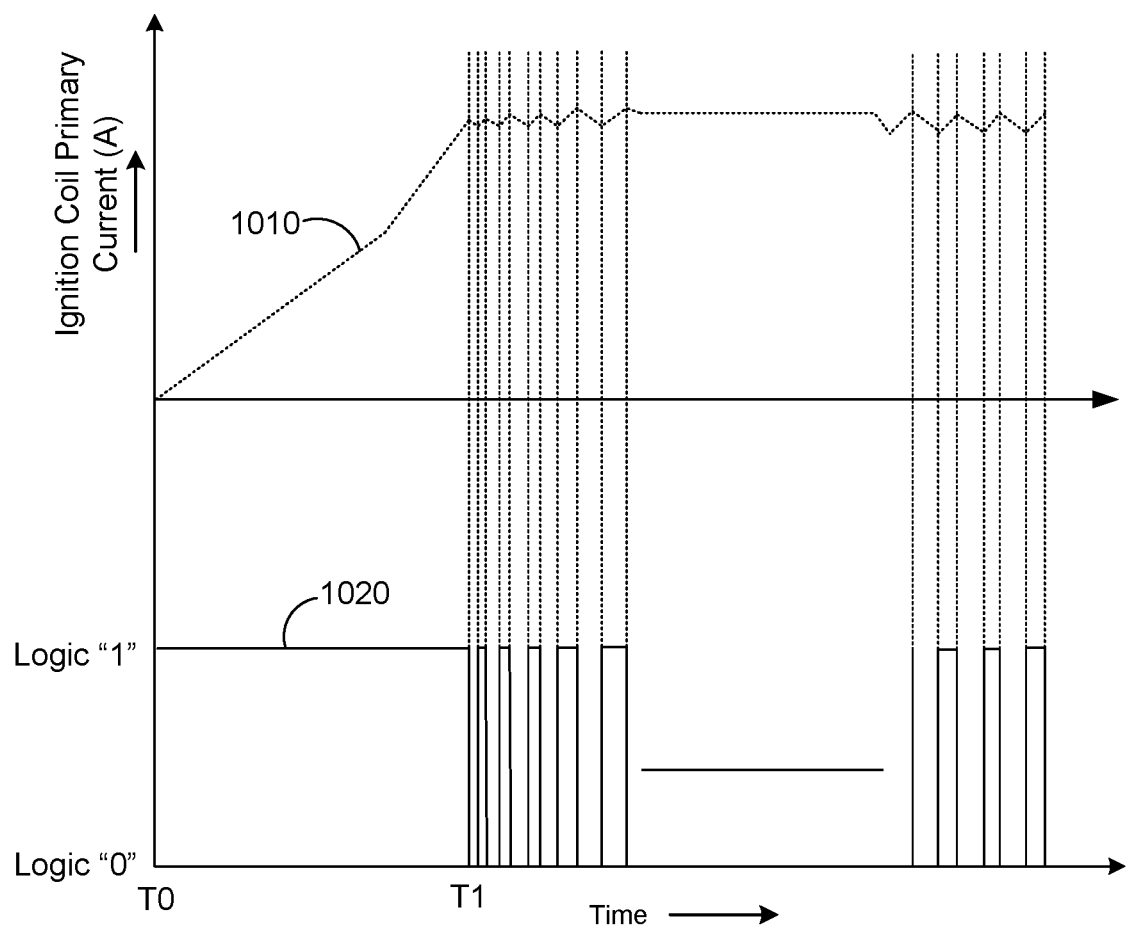
FIG. 10 is a diagram that illustrates operation of an ignition system using a variable frequency control signal to implement circulating-current control.

FIG. 10 is a diagram (timing diagram) that illustrates operation of an ignition system, such as the ignition systems 100 and 200, using a variable frequency control signal to implement circulating-current control in an ignition control circuit, such as using the ignition control circuits 150 and 250. For purposes of illustration, the diagram of FIG. 10 will be described with further reference to the ignition system 100 of FIGS. 1 and 5. However, in some implementations, the diagram of FIG. 10 can also correspond with operation of the ignition system 200 of FIGS. 2 and 6 using circulating-current control, as well as with operation of other ignition systems having other configurations and implementing circulating-current control, such as in accordance with the approaches described herein.

In the diagram of FIG. 10, time is illustrated on the x-axis, primary current (of the ignition coil 132) is illustrated on the y-axis in an upper portion of the diagram (by trace 1010), and values of a logic signal (shown by logic signal trace 1020) are illustrated in a lower portion of the diagram of FIG. 10. In some implementations, the logic signal 1020 can be used for the alternative and complimentary switching between the circulating-current path control circuit P1 and the charge path control circuit P2. In the example implementation of FIG. 5, where the control path circuits P1 and P2 both include NMOS devices M1 and M2, the logic signal 1020, during initial charging of the ignition coil 132 (between time Tm0 and time Tm1) and during circulating-current control (e.g., after time Tm1 in FIG. 10), can be applied to a gate of the device M2, while an inverse (complimentary) signal can be applied to a gate of the device M1. In other instances, some of which are described herein (e.g., solid-state fuse functionality), independent signals can be applied to the devices M1 and M2 of the path control circuits P1 and P2, which can be the same logic value (e.g., logic "0" to deactivate both path control circuits 1 and 2), or can be opposite logic values that are independently generated (e.g., not generated based on complimentary or inverse signals).

In the diagram of FIG. 10, the time Tm0 and the time Tm1 can correspond, respectively, with the time Tm0 and the time Tm1 of, for example, FIGS. 9A-9D. For instance, at time Tm0 in FIG. 10, the control circuit 110 can receive an indication (via a change in a logic level of a command signal received from the ECU 140 on terminal T1) to begin operation of the ignition control circuit 150 and the ignition circuit 130, and the logic signal 1020 can be set to logic "1" (logic high) to enable the charge path control circuit P2, and the switch circuit 120 can also be enabled (e.g., based on a command signal from the ECU). That is, in response to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130.

At time Tm1 in FIG. 10, an initial charging threshold for the ignition coil 132 can be reached, and the ignition control circuit 150 can begin operating using circulating-current control to maintain the primary current of the ignition coil 132 in accordance with one or more current limits, such as using the approaches described herein.

For instance, in FIG. 10, after time Tm1, the ignition system 100 can be operated (e.g., by the control circuit 110) in a circulating-current control mode to maintain the primary current in accordance with the one or more current limits. As discussed herein, circulating-current control can be implemented in the ignition system 100 by alternatively and complementarily activating and deactivating the circulating-current path control circuit P1 and the charge path control circuit P2 using appropriate timing. For instance, in the diagram of FIG. 10, the logic signal 1020 used to alternatively and complimentarily activate and deactivate the circulating-current path control circuit P1 and the charge path control circuit P2 is a variable frequency, fixed duty cycle (e.g., 50% duty cycle) signal. As shown in FIG. 10, the signal 1020 can initially have a relatively short period (relatively high frequency), where the period of the signal 1020 increases (and the frequency decreases) over time. Such an approach, in some implementations, can reduce transient voltage spiking in the ignition coil 132, where such transient voltage spiking can cause undesired sparking event in the spark plug SP of the ignition circuit 130. In some implementations, the variable frequency of the logic signal 1020 and/or the duty cycle can be predetermined, or can be dynamically determined based on, e.g., a current through the primary winding of the ignition coil 132 that is sensed by the control circuit 100, the one or more current limits used for circulating current control, etc.

Figure 11B:
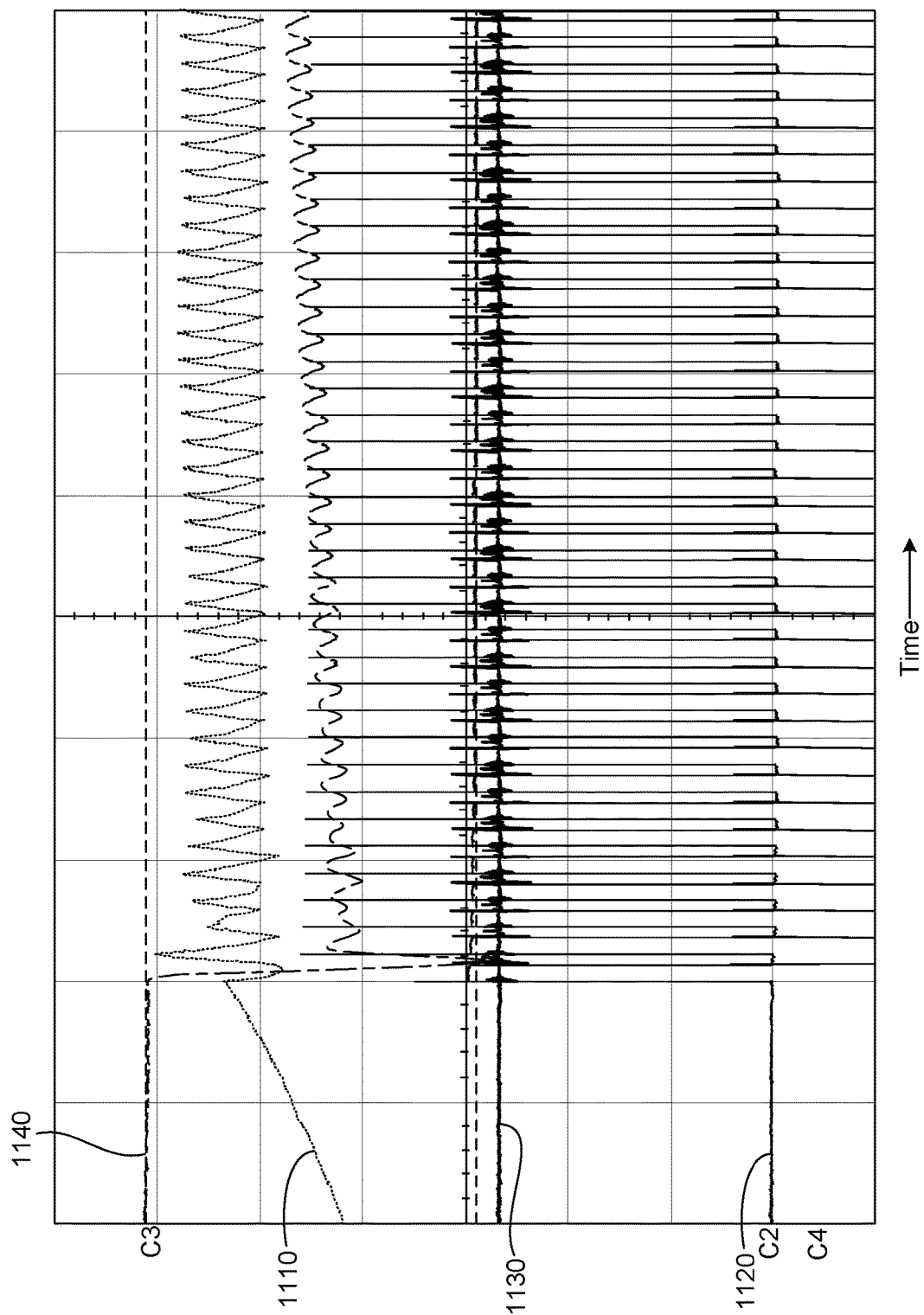

FIGS. 11A and 11B are diagrams that collectively illustrate operation of an ignition system using a fixed frequency and fixed duty ratio control signal to implement circulating-current control, such as using the ignition control circuits 150 and 250. For purposes of illustration, the diagrams of FIGS. 11A and 11B will be described with further reference to the ignition system 100 of FIGS. 1 and 5. However, in some implementations, the diagrams of FIGS. 11A and 11B can also correspond with operation of the ignition system 200 of FIGS. 2 and 6 using circulating-current control, as well as with operation of other ignition systems having other configurations and implementing circulating-current control, such as in accordance with the approaches described herein.

In the diagram of FIGS. 11A and 11B, time is illustrated on the x-axis, while the y-axis is used to illustrate (1) primary current for the ignition coil with trace 1110; (2) voltage (Vsec) for a secondary winding of the ignition coil 132 with trace 1140; (3) logic levels for a signal (provided by the control circuit 110) to alternatively and complimentary switch between activation and deactivation of the circulating-current control path circuit P1 and the charge path control circuit P2 with trace 1120; and (4) logic levels for a command signal (with device SW, e.g., IGBT1, control signal) from the ECU 140 with trace 1130. In this example implementation, the logic signal illustrated by the trace 1120 is shown with reverse logic (is inverted) from the signal 1020 shown in FIG. 10. Accordingly, the logic signal 1120 can be, in the example implementation of FIG. 5, used to control (applied to a gate terminal of) the NMOS device M1 (the circulating-current path control circuit P1) via terminal T4 of the control circuit 110, while an inverse of the logic signal of the trace 1120 can be used to control (e.g., be applied to a gate terminal of) the NMOS device M2 (the charge path control circuit P2) via terminal T5 of the control circuit 110.

As with the diagram of FIG. 10, in the diagrams of FIGS. 11A and 11B, the time Tm0 and the time Tm1 can correspond, respectively, with the time Tm0 and the time Tm1 of, for example, FIGS. 9A-9D. FIG. 11A illustrates operation of the ignition system 100 for a single spark event, using circulating-current control, while FIG. 11B illustrates a magnified (zoomed in) portion of the diagram of FIG. 11A around time Tm1.

As with the implementation shown in FIG. 10, at time Tm0 in FIG. 11A the control circuit 110 can receive an indication (via a change in a logic level of a command signal, e.g., the logic signal 1130, received from the ECU 140 on terminal T1) to begin operation of the ignition control circuit 150 and the ignition circuit 130. With the logic signal 1120 being of reversed logic from the logic signal 1020, the logic signal 1120, at time Tm0, can be set to logic "0" (logic low) to enable the charge path control circuit P2. At time Tm0, the switch circuit 120 can also be enabled (e.g., based on the logic (command) signal 1130 from the ECU, such as a signal from the control circuit 110 that is based on the logic signal 1130). That is, in response to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130.

At time Tm1, as shown in FIGS. 11A and 11B, an initial charging threshold for the ignition coil 132 can be reached, and the ignition control circuit 150 can begin operating using circulating-current control to maintain the primary current of the ignition coil 132 in accordance with one or more current limits, such as using the approaches described herein.

For instance, as shown in FIGS. 11A and 11B, after time Tm1, the ignition system 100 can be operated (e.g., by the control circuit 110) in a circulating-current control mode to maintain the primary current in accordance with the one or more current limits. As discussed herein, circulating-current control can be implemented in the ignition system 100 by alternatively and complementarily activating and deactivating the circulating-current path control circuit P1 and the charge path control circuit P2 using appropriate timing. For instance, as illustrated in the zoomed in diagram of FIG. 11B, the logic signal 1120 used to alternatively and complimentarily activate and deactivate the circulating-current path control circuit P1 and the charge path control circuit P2 is a constant frequency (e.g., 45 kilohertz (kHz)), and fixed duty cycle (e.g., 40% duty cycle) signal. In some implementations, the fixed frequency of the logic signal 1120 and/or the fixed duty cycle can be predetermined, or can be dynamically determined based on, e.g., a current through the primary winding of the ignition coil 132 that is sensed by the control circuit 100, the one or more current limits used for circulating current control, etc.

As also shown in FIG. 11A, a spark event can be initiated in the spark plug SP. In response to the indication at time Tm2 (by the logic signal 1130 deactivating the switch device 120). For instance, the control circuit 110 can deactivate the switch circuit 120 using the logic signal 1130, and/or deactivate the charge path control circuit P2 (using an inverse of the logic signal 1120). This deactivation of the switch circuit 120 and/or the charge path control circuit P2 will cause the primary current to rapidly drop to, or near, zero and cause a resulting spike in a voltage across the primary winding. As discussed above, this spike in voltage will result in energy stored in the primary winding of the ignition coil 130 being transferred to the secondary winding of the ignition coil 130, causing a spike in Vsec (as shown by the trace 1140), which will further cause a spark event in the spark plug SP. In some implementations, the control circuit 110 can also, in response to the indication at time Tm2, deactivate the circulating-current path control circuit P1.

Figure 12B:
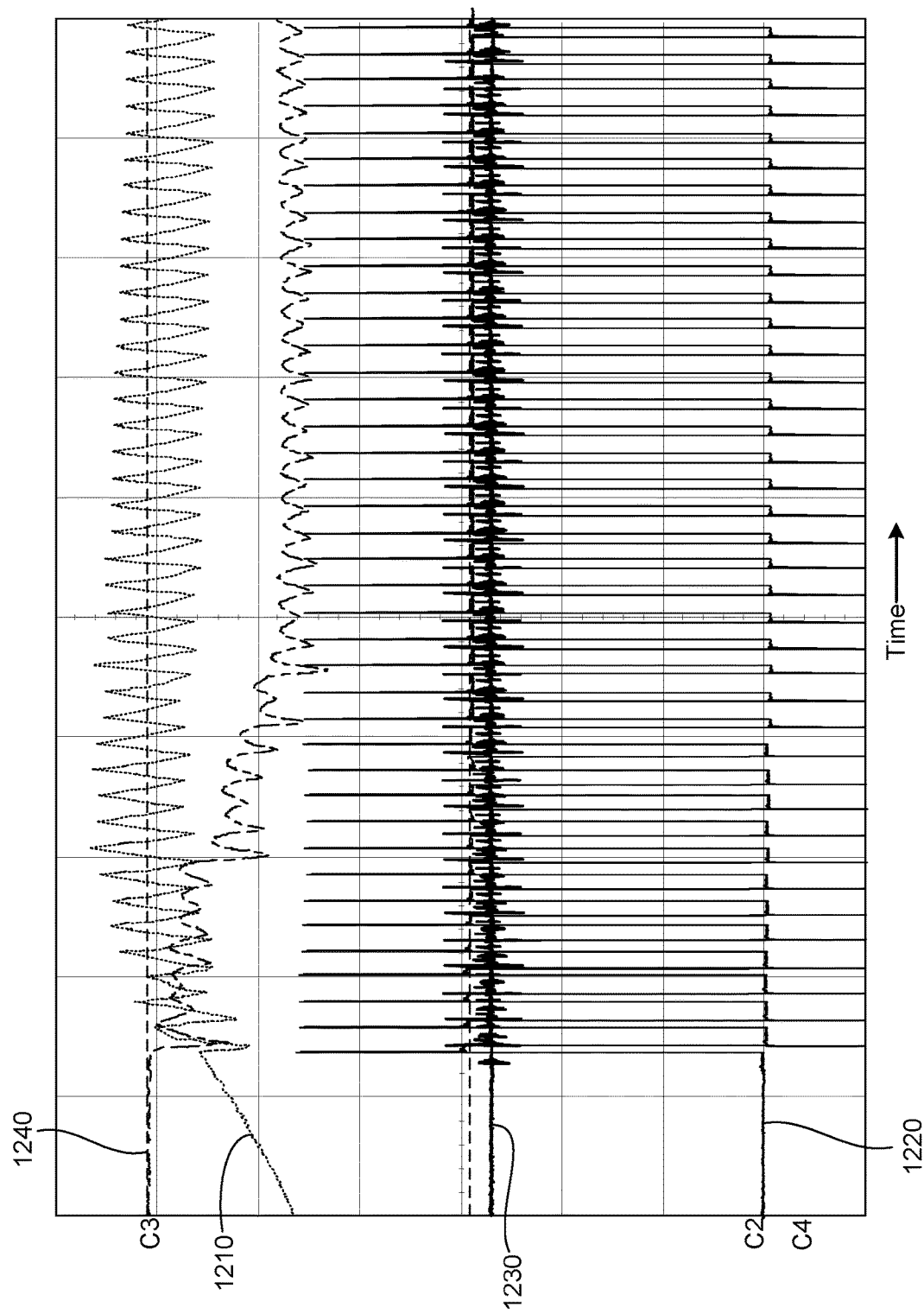

FIGS. 12A and 12B are diagrams that collectively illustrate operation of an ignition system using a fixed frequency and variable duty ratio control signal to implement circulating-current control, such as using the ignition control circuits 150 and 250. For purposes of illustration, the diagrams of FIGS. 12A and 12B will be described with further reference to the ignition system 100 of FIGS. 1 and 5. However, in some implementations, the diagrams of FIGS. 12A and 12B can also correspond with operation of the ignition system 200 of FIGS. 2 and 6 using circulating-current control, as well as with operation of other ignition systems having other configurations and implementing circulating-current control, such as in accordance with the approaches described herein.

In the diagram of FIGS. 12A and 12B, as with the FIGS. 11A and 11B, time is illustrated on the x-axis, while the y-axis is used to illustrate (1) primary current for the ignition coil with trace 1210; (2) voltage (Vsec) for a secondary winding of the ignition coil 132 with trace 1240; (3) logic levels for a signal (provided by the control circuit 110) to alternatively and complimentary switch between activation and deactivation of the circulating-current control path circuit P1 and the charge path control circuit P2 with trace 1220; and (4) logic levels for a command signal (with device SW, e.g., IGBT1, control signal) from the ECU 140 with trace 1230. In this example implementation, as with FIGS. 11A and 11B, the logic signal illustrated by the trace 1220 is shown with reverse logic (is inverted) from the signal 1020 shown in FIG. 10. Accordingly, the logic signal 1220 can be used, in the example implementation of FIG. 5, to control (be applied to a gate terminal of) the NMOS device M1 (the circulating-current path control circuit P1) via terminal T4 of the control circuit 110, while an inverse of the logic signal of the trace 1220 can be used to control (e.g., be applied to a gate terminal of) the NMOS device M2 (the charge path control circuit P2) via terminal T5 of the control circuit 110.

As with the diagrams of FIGS. 11A and 11B, in the diagrams of FIGS. 12A and 12B, the time Tm0 and the time Tm1 can correspond, respectively, with the time Tm0 and the time Tm1 of, for example, FIGS. 9A-9D. Similar to FIG. 11A, FIG. 12A illustrates operation of the ignition system 100 for a single spark event, using circulating-current control, while FIG. 12B illustrates a magnified (zoomed in) portion of the diagram of FIG. 11A around time Tm1.

As with the implementation shown in FIG. 11A, at time Tm0 in FIG. 12A the control circuit 110 can receive an indication (via a change in a logic level of a command signal, e.g., the logic signal 1230, received from the ECU 140 on terminal T1) to begin operation of the ignition control circuit 150 and the ignition circuit 130. With the logic signal 1220 being of reversed logic from the logic signal 1020, the logic signal 1220, at time Tm0, can be set to logic "0" (logic low) to enable the charge path control circuit P2. At time Tm0, the switch circuit 120 can also be enabled (e.g., based on the logic (command) signal 1230 from the ECU 140, such as a signal from the control circuit 110 that is based on the logic signal 1230). That is, in response to the indication at time Tm0, the control circuit 110 can deactivate the circulating-current path control circuit P1, activate the charge path control circuit P2, and activate the switch circuit 120 (e.g., turn on the IGBT device IGBT1) to begin charging the primary winding of the ignition coil 130.

At time Tm1, as shown in FIGS. 12A and 12B, an initial charging threshold for the ignition coil 132 can be reached, and the ignition control circuit 150 can begin operating using circulating-current control to maintain the primary current of the ignition coil 132 in accordance with one or more current limits, such as using the approaches described herein.

For instance, as shown in FIGS. 12A and 12B, after time Tm1, the ignition system 100 can be operated (e.g., by the control circuit 110) in a circulating-current control mode to maintain the primary current in accordance with the one or more current limits. As discussed herein, circulating-current control can be implemented in the ignition system 100 by alternatively and complementarily activating and deactivating the circulating-current path control circuit P1 and the charge path control circuit P2 using appropriate timing. For instance, as illustrated in the zoomed in diagram of FIG. 12B, the logic signal 1220 used to alternatively and complimentarily activate and deactivate the circulating-current path control circuit P1 and the charge path control circuit P2 is a constant frequency (e.g., 45 kilohertz (kHz)), and variable duty cycle (e.g., 20%-60% for duty cycle for P1 and/or 80%-40% duty cycle for P2) signal. In some implementations, the fixed frequency of the logic signal 1220 and/or its variable duty cycle can be predetermined, or can be dynamically determined based on, e.g., a current through the primary winding of the ignition coil 132 that is sensed by the control circuit 100, the one or more current limits used for circulating current control, etc. Such an approach (e.g., using a variable duty cycle), in some implementations, can reduce transient voltage spiking in the ignition coil 132, where such transient voltage spiking can cause undesired sparking event in the spark plug SP of the ignition circuit 130.

As also shown in FIG. 12A, a spark event can be initiated in the spark plug SP. In response to the indication at time Tm2 (by the logic signal 1230 deactivating the switch device 120). For instance, the control circuit 110 can deactivate the switch circuit 120 using the logic signal 1230, and/or deactivate the charge path control circuit P2 (using an inverse of the logic signal 1220). This deactivation of the switch circuit 120 and/or the charge path control circuit P2 will cause the primary current to rapidly drop to, or near, zero and cause a resulting spike in a voltage across the primary winding. As discussed above, this spike in voltage will result in energy stored in the primary winding of the ignition coil 130 being transferred to the secondary winding of the ignition coil 130, causing a spike in Vsec (as shown by the trace 1240), which will further cause a spark event in the spark plug SP. In some implementations, the control circuit 110 can also, in response to the indication at time Tm2, deactivate the circulating-current path control circuit P1.

It will be understood that, in the foregoing description, when an element is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element, there are no intervening elements present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Implementations of the various techniques described herein may be implemented in (e.g., included in) digital electronic circuitry, or in computer hardware, firmware, software, or in combinations of them. Portions of methods also may be performed by, and an apparatus may be implemented as, special purpose logic circuitry, e.g., an FPGA (field programmable gate array) or an ASIC (application specific integrated circuit).

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A circuit, comprising:
    a switch circuit configured to be electrically connected to a first terminal of a primary winding of an ignition coil included in an ignition circuit;
    a charge path control circuit electrically coupled between the switch circuit and a ground terminal, such that the primary winding, the switch circuit and the charge path control circuit are electrically coupled in series;
    a circulating-current path control circuit electrically connected between the switch circuit and a battery terminal, the battery terminal being configured to be electrically connected to a second terminal of the primary winding of the ignition coil; and
    a control circuit configured to operate the switch circuit, the charge path control circuit and the circulating-current path control circuit to:
        provide a current to charge the primary winding of the ignition coil until a threshold current is reached in the primary winding by enabling the charge path control circuit and the switch circuit;
        after reaching the threshold current in the primary winding, maintaining, until a spark is initiated in a spark plug included in the ignition circuit, a current in the primary winding of the ignition coil in correspondence with a current limit by alternately deactivating the circulating-current path control circuit; and
        initiating the spark in the spark plug included in the ignition circuit, the initiating the spark including controlling an amount of energy delivered from the primary winding to a secondary winding of the ignition coil.

2. The circuit of claim 1, wherein:
    the circulating-current path control circuit, when the circulating-current path control circuit is activated and the charge path control circuit is deactivated, defines a looped path including the switch circuit, the battery terminal, and terminals configured to be electrically connected with the ignition coil; and the charge path control circuit, when the charge path control circuit is activated and the circulating-current path control circuit is deactivated, defines a grounded path including the battery terminal, the switch circuit, the ground terminal, and terminals configured to be electrically connected with the ignition coil.

3. The circuit of claim 1, wherein the current limit is equal to the threshold current.

4. The circuit of claim 1, wherein maintaining the current in the primary winding of the ignition coil in correspondence with the current limit includes dithering the current in the primary winding around the current limit.

5. The circuit of claim 1, wherein the current limit is a first current limit, the control circuit being further configured to operate the switch circuit, the charge path control circuit and the circulating-current path control circuit to maintain the current in the primary winding of the ignition coil between the first current limit and a second current limit, the second current limit being less than the first current limit.

6. The circuit of claim 1, wherein controlling an amount of energy delivered to the secondary winding of the ignition coil includes controlling a deactivation time of at least one of the switch circuit or the charge path control circuit.

7. The circuit of claim 1, wherein maintaining the current in the primary winding of the ignition coil in correspondence with the current limit includes operating the circulating-current path control circuit and the charge path control circuit as a complimentary pair.

8. The circuit of claim 7, wherein operating the circulating-current path control circuit and the charge path control circuit as a complimentary pair includes operating the circulating-current path control circuit and the charge path control circuit using a variable frequency signal.

9. The circuit of claim 8, wherein the control circuit is further configured to determine a frequency of the variable frequency signal based on a current sensed in the primary winding.

10. The circuit of claim 7, wherein operating the circulating-current path control circuit and the charge path control circuit as a complimentary pair includes operating the circulating-current path control circuit and the charge path control circuit using a fixed frequency signal with a variable duty cycle.

11. The circuit of claim 10, wherein the control circuit is further configured to determine a duty cycle of the fixed frequency signal based on a current sensed in the primary winding.

12. A circuit, comprising:
a switch circuit configured to be electrically connected to a first terminal of a primary winding of an ignition coil included in an ignition circuit;
a ground terminal;
a battery terminal;
a charge path control circuit that is electrically coupled with the battery terminal and configured to be electrically coupled with a second terminal of the primary winding, such that the battery terminal, the charge path control circuit, the primary winding and the switch circuit are electrically coupled in series;
a circulating-current path control circuit that is electrically coupled with the ground terminal and configured to be electrically coupled with the second terminal of the primary winding; and a control circuit configured to operate the switch circuit, the charge path control circuit and the circulating-current path control circuit to:
provide a current to charge the primary winding of the ignition coil until a threshold current is reached in the primary winding by enabling the charge path control circuit and the switch circuit;
after reaching the threshold current in the primary winding, maintaining, until a spark is initiated in a spark plug included in the ignition circuit, a current in the primary winding of the ignition coil in correspondence with at least one current limit by activating and deactivating the circulating-current path control circuit; and
initiating the spark in the spark plug included in the ignition circuit, the initiating the spark including controlling an amount of energy delivered to a secondary winding of the ignition coil.

13. The circuit of claim 12, wherein:
the circulating-current path control circuit, when the circulating-current path control circuit is activated and the charge path control circuit is deactivated, defines a looped path including the switch circuit, the ground terminal, and terminals configured to be electrically connected with the ignition coil; and
the charge path control circuit, when the charge path control circuit is activated and the circulating-current path control circuit is deactivated, defines a grounded path including the battery terminal, the switch circuit, the ground terminal, and terminals configured to be electrically connected with the ignition coil.

14. The circuit of claim 12, wherein maintaining the current in the primary winding of the ignition coil in correspondence with the at least one current limit includes operating the circulating-current path control circuit and the charge path control circuit as a complimentary pair.

15. The circuit of claim 14, wherein operating the circulating-current path control circuit and the charge path control circuit as a complimentary pair includes operating the circulating-current path control circuit and the charge path control circuit using a variable frequency signal.

16. The circuit of claim 14, wherein operating the circulating-current path control circuit and the charge path control circuit as a complimentary pair includes operating the circulating-current path control circuit and the charge path control circuit using a fixed frequency signal with a variable duty cycle.

17. The circuit of claim 12, wherein controlling an amount of energy delivered to the secondary winding of the ignition coil includes controlling a deactivation time of at least one of the switch circuit and the charge path control circuit.

18. A method of operating an ignition circuit, the method comprising:
enabling a charge path control circuit and a switch circuit to charge a primary winding of an ignition coil of the ignition circuit until a threshold current is reached in the primary winding, the charge path control circuit, the primary winding and the switch circuit being electrically coupled in series;
after reaching the threshold current in the primary winding, maintaining, until a spark is initiated in a spark plug included in the ignition circuit, a current in the primary winding of the ignition coil in correspondence with a current limit by alternately activating and deactivating the charge path control circuit complementary to alternate activation and deactivation of a circulating-current path control circuit, the circulating-current path control circuit, the primary winding and the switch circuit being electrically coupled in series in a looped path; and initiating the spark in the spark plug included in the ignition circuit, the initiating the spark including controlling an amount of energy delivered from the primary winding to a secondary winding of the ignition coil.

19. The method of claim 18, wherein controlling an amount of energy delivered to the secondary winding of the ignition coil includes controlling a deactivation time of at least one of the switch circuit and the charge path control circuit.

20. The method of claim 19, wherein the deactivation time is determined based on the current in the primary winding.

* * * * *